United States Patent
Fukuzumi et al.

(10) Patent No.: US 8,350,326 B2
(45) Date of Patent: Jan. 8, 2013

(54) NONVOLATILE SEMICONDUCTOR MEMORY DEVICE

(75) Inventors: Yoshiaki Fukuzumi, Kanagawa-ken (JP); Ryota Katsumata, Mie-ken (JP); Masaru Kito, Kanagawa-ken (JP); Masaru Kidoh, Mie-ken (JP); Hiroyasu Tanaka, Mie-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 356 days.

(21) Appl. No.: 12/839,895

(22) Filed: Jul. 20, 2010

(65) Prior Publication Data
US 2011/0233644 A1 Sep. 29, 2011

(30) Foreign Application Priority Data
Mar. 24, 2010 (JP) ................. 2010-067582

(51) Int. Cl.
*H01L 29/792* (2006.01)
(52) U.S. Cl. . 257/342; 257/324; 257/316; 257/E21.679; 257/E29.309; 257/E27.102
(58) Field of Classification Search ........... 257/E21.679, 257/324, E29.309, 316, E27.102
See application file for complete search history.

(56) References Cited

U.S. PATENT DOCUMENTS

| | | |
|---|---|---|
| 2007/0252201 A1 | 11/2007 | Kito et al. |
| 2011/0127597 A1 | 6/2011 | Fukuzumi et al. |

FOREIGN PATENT DOCUMENTS

| | | |
|---|---|---|
| JP | 2009-146954 | 7/2009 |
| WO | WO 2009/075370 A1 | 6/2009 |
| WO | WO 2010/004706 A1 | 1/2010 |

OTHER PUBLICATIONS

U.S. Appl. No. 12/943,349, filed Nov. 10, 2010, Katsumata, et al.
U.S. Appl. No. 13/052,161, filed Mar. 21, 2011, Oota, et al.
U.S. Appl. No. 12/679,991, filed Mar. 25, 2010, Yoshiaki Fukuzumi, et al.
U.S. Appl. No. 12/883,757, filed Sep. 16, 2010, Kidoh, et al.
U.S. Appl. No. 12/886,132, filed Sep. 20, 2010, Yahashi, et al.
U.S. Appl. No. 12/886,010, filed Sep. 20, 2010, Tanaka, et al.

*Primary Examiner* — Julio J Maldonado
*Assistant Examiner* — Hajar Kolahdouzan
(74) *Attorney, Agent, or Firm* — Oblon, Spivak, McClelland, Maier & Neustadt, L.L.P.

(57) ABSTRACT

According to one embodiment, a nonvolatile semiconductor memory device includes first and second stacked structural bodies, first and second semiconductor pillars, a memory unit connection portion, a selection unit stacked structural body, first and second selection unit semiconductor pillars, a selection unit connection portion, and first to fifth interconnections. The semiconductor pillars pierce the stacked structural bodies. The first and second interconnections are connected to the first and second semiconductor pillars, respectively. The memory unit connection portion connects the first and second semiconductor pillars. The selection unit semiconductor pillars pierce the selection unit stacked structural body. The third and fourth interconnections are connected to the first and second selection unit semiconductor pillars, respectively. The selection unit connection portion connects the first and second selection unit semiconductor pillars. The fifth interconnection is connected to the third interconnection on a side opposite to the selection unit stacked structural body.

20 Claims, 13 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-067582, filed on Mar. 24, 2010; the entire contents of which are incorporated herein by reference.

FIELD

Embodiments described herein relate generally to a nonvolatile semiconductor memory device.

BACKGROUND

In conventional nonvolatile semiconductor memory devices (memory), elements have been integrated in a two-dimensional plane on a silicon substrate. Although the dimensions of one element have been reduced (downscaled) to increase the storage capacity of memory, such downscaling in recent years has become difficult in regard to both cost and technology.

Conversely, collectively patterned three-dimensionally stacked memory has been proposed. Such a collectively patterned three-dimensionally stacked memory includes a stacked body having insulating films alternately stacked with electrode films, silicon pillars piercing the stacked body, and charge storage layers (memory layers) between the silicon pillars and the electrode films. Thereby, memory cells are provided at the intersections between the silicon pillars and each of the electrode films.

Further, JP-A 2009-146954 (Kokai) discloses a configuration using a memory string having a U-shaped configuration made by connecting two silicon pillars on the substrate side. By using such a U-shaped memory string, for example, the degrees of freedom of the material used in the charge storage layer can be increased.

However, there is room for improvement to further increase productivity and operational stability.

DETAILED DESCRIPTION

Figure 1:
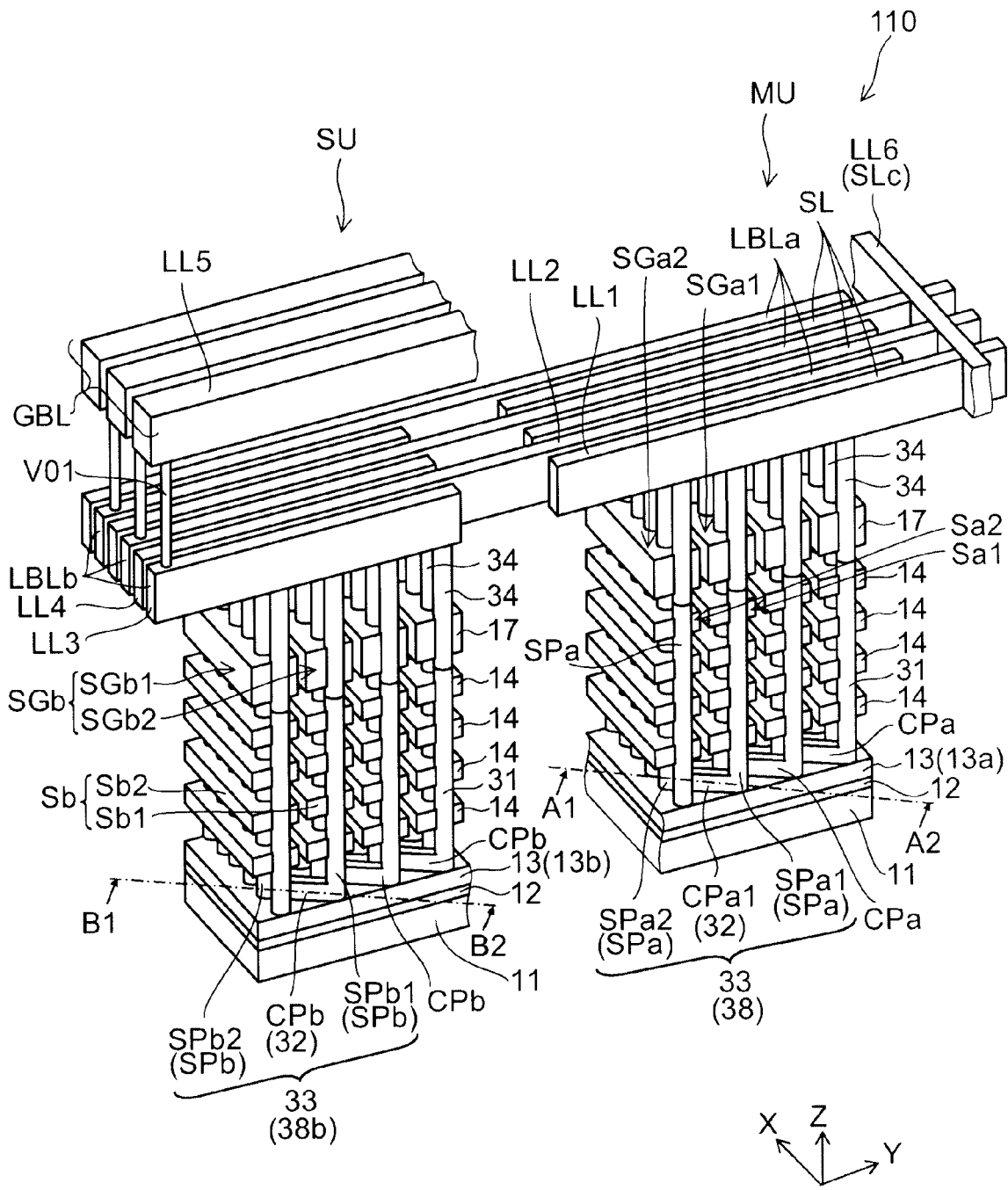
FIG. 1 is a schematic perspective view of the configuration of a nonvolatile semiconductor memory device according to a first embodiment.

In general, according to one embodiment, a nonvolatile semiconductor memory device includes a first stacked structural body, a first selection gate electrode, a first semiconductor pillar, a first memory layer, a second stacked structural body, a second selection gate electrode, a second semiconductor pillar, a second memory layer, a first interconnection, a second interconnection, a memory unit connection portion, a selection unit stacked structural body, a selection unit selection gate electrode, a first selection unit semiconductor pillar, a second selection unit semiconductor pillar, a third interconnection, a fourth interconnection, a selection unit connection portion, and a fifth interconnection. The first stacked structural body includes a plurality of first electrode films alternately stacked in a first direction with a plurality of first inter-electrode insulating films. The plurality of first electrode films and the plurality of first inter-electrode insulating films are aligned in a second direction orthogonal to the first direction. The first selection gate electrode is stacked with the first stacked structural body along the first direction to align in the second direction. The first semiconductor pillar pierces the first stacked structural body and the first selection gate electrode in the first direction. The first memory layer is provided between the first semiconductor pillar and each of the plurality of first electrode films. The second stacked structural body includes a plurality of second electrode films alternately stacked in the first direction with a plurality of second inter-electrode insulating films. The plurality of second electrode films and the plurality of second inter-electrode insulating films are aligned in the second direction. The second selection gate electrode is stacked with the second stacked structural body along the first direction to align in the second direction. The second semiconductor pillar pierces the second stacked structural body and the second selection gate electrode in the first direction. The second memory layer is provided between the second semiconductor pillar and each of the plurality of second electrode films. The first interconnection is connected to one end of the first semiconductor pillar to align in a third direction orthogonal to the first direction and intersecting the second direction. The second interconnection is connected to one end of the second semiconductor pillar to align in the third direction. The memory unit connection portion connects one other end of the first semiconductor pillar to one other end of the second semiconductor pillar. The selection unit stacked structural body includes a plurality of selection unit electrode films alternately stacked in the first direction with a plurality of selection unit inter-electrode insulating films. The selection unit selection gate electrode is stacked with the selection unit stacked structural body along the first direction. The first selection unit semiconductor pillar and the second selection unit semiconductor pillar pierce the selection unit stacked structural body and selection unit selection gate electrode in the first direction. The third interconnection is connected to one end of the first selection unit semiconductor pillar to align in a fourth direction orthogonal to the first direction. The fourth interconnection is aligned in the fourth direction to electrically connect to the second interconnection and connect to one end of the second selection unit semiconductor pillar. The selection unit connection portion connects one other end of the first selection unit semiconductor pillar to one other end of the second selection unit semiconductor pillar. The fifth interconnection is aligned in a fifth direction orthogonal to the first direction on a side of the third interconnection opposite to the selection unit stacked structural body. The fifth interconnection is electrically connected to the third interconnection.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic perspective view illustrating the configuration of a nonvolatile semiconductor memory device according to a first embodiment.

Figure 2:
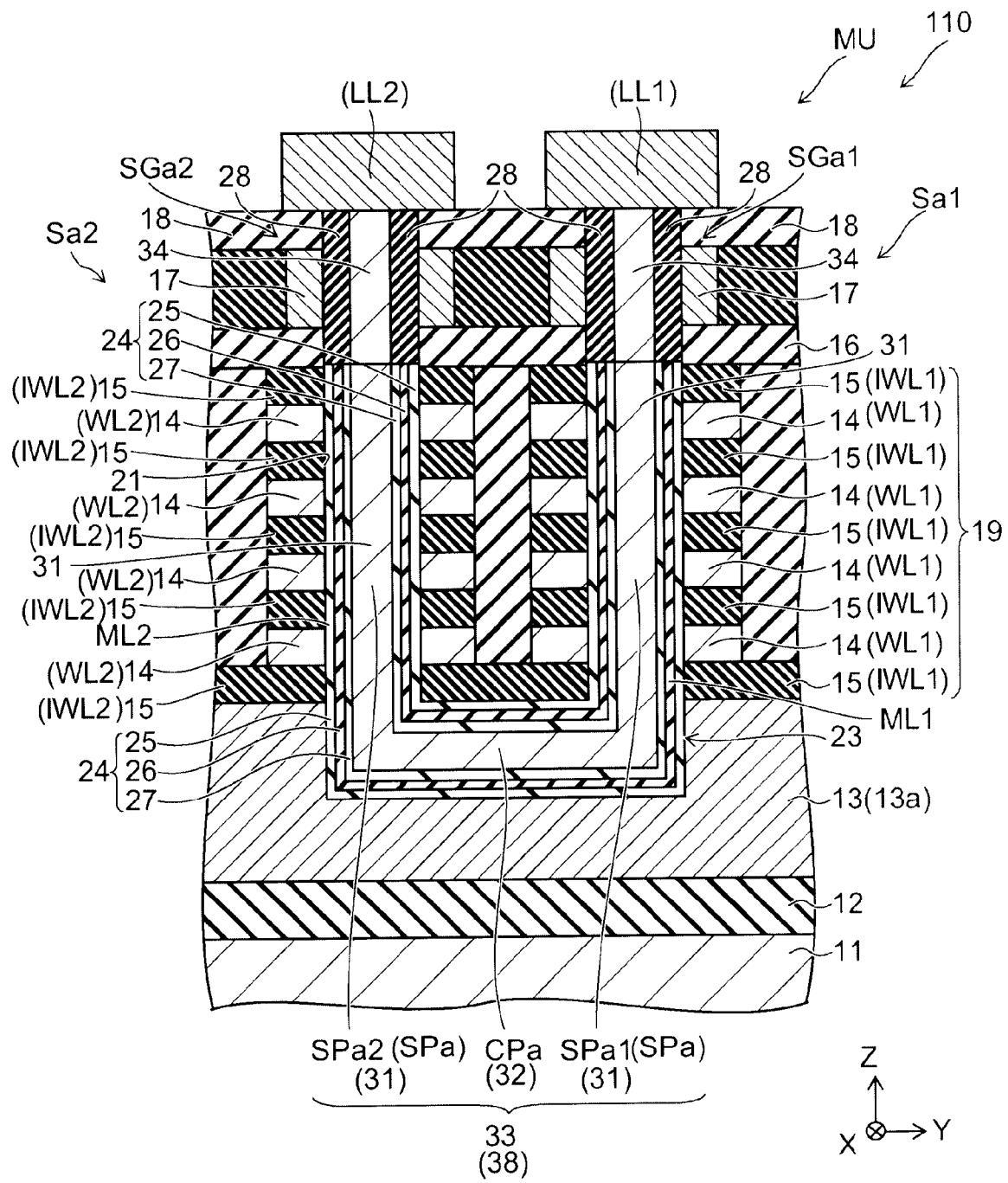
FIG. 2 is a schematic cross-sectional view of the configuration of a portion of the nonvolatile semiconductor memory device according to the first embodiment.

FIG. 2 is a schematic cross-sectional view illustrating the configuration of a portion of the nonvolatile semiconductor memory device according to the first embodiment. Namely, FIG. 2 is a cross-sectional view along line A1-A2 of FIG. 1.

Figure 3:
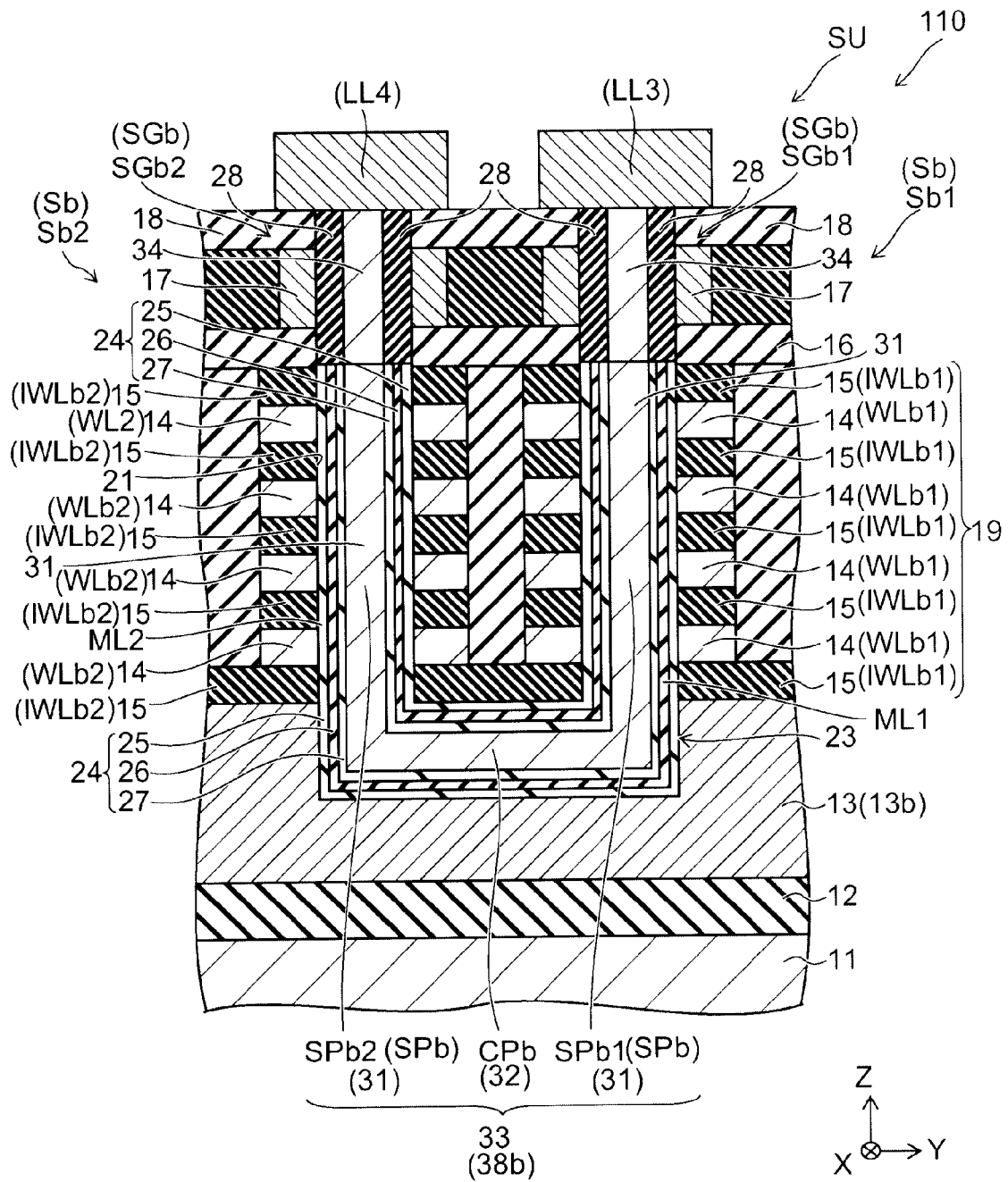
FIG. 3 is a schematic cross-sectional view of the configuration of a portion of the nonvolatile semiconductor memory device according to the first embodiment.

FIG. 3 is a schematic cross-sectional view illustrating the configuration of a portion of the nonvolatile semiconductor memory device according to the first embodiment. Namely, FIG. 3 is a cross-sectional view along line B1-B2 of FIG. 1.

Figure 4:
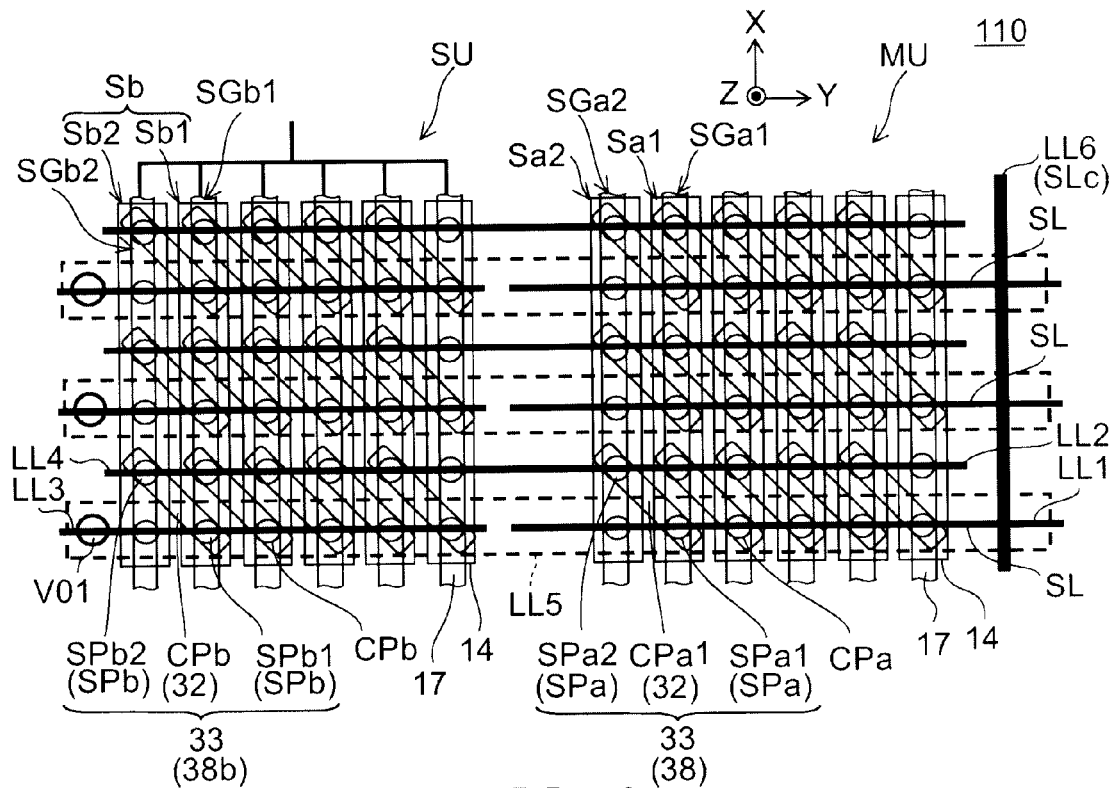
FIG. 4 is a schematic plan view of the configuration of the nonvolatile semiconductor memory device according to the first embodiment.

FIG. 4 is a schematic plan view illustrating the configuration of the nonvolatile semiconductor memory device according to the first embodiment.

For easier viewing of the drawing in FIG. 1, only the conductive portions are illustrated, and a portion of the insulating portions are omitted. For easier viewing of the drawing in FIG. 4, the proportions of the dimensions of the portions are slightly different from those of FIG. 1 to FIG. 3 to avoid lines overlapping each other.

As illustrated in FIG. 1, a nonvolatile semiconductor memory device 110 according to this embodiment includes a memory cell array unit MU and a selection unit SU. That is, the memory cell array unit MU and the selection unit SU are provided on a substrate 11 made of, for example, silicon.

Stacked bodies 19 are provided on the substrate 11 in the memory cell array unit MU and the selection unit SU. The stacked body 19 includes multiple electrode films 14 alternately stacked with multiple inter-electrode insulating films 15 (not illustrated in FIG. 1).

Herein, the stacking direction of the multiple electrode films 14 is taken as a Z axis direction (a first direction). One direction perpendicular to the Z axis direction is taken as an X axis direction (a second direction). A direction perpendicular to the Z axis direction and the X axis direction is taken as a Y axis direction. For convenience of description, the direction from the substrate 11 toward the stacked body 19 is taken as the upward direction.

In this specific example, a polysilicon film, for example, is provided on the substrate 11 via an insulating film 12. The polysilicon film forms a back gate 13.

In the memory cell array unit MU as illustrated in FIG. 1 and FIG. 2, the stacked body 19 is divided, for example, along the Y axis direction. In other words, the stacked body 19 of the memory cell array unit MU includes a first stacked structural body Sa1 aligned in the X axis direction and a second stacked structural body Sat aligned in the X axis direction. The stacked body 19 may include more stacked structural bodies.

The first stacked structural body Sa1 includes multiple first electrode films WL1 aligned in the X axis direction and alternately stacked in the first direction with multiple first inter-electrode insulating films IWL1. In other words, the first stacked structural body Sa1 includes the multiple first electrode films WL1 (the electrode films 14) aligned in the X axis direction and stacked in the Z axis direction and the multiple first inter-electrode insulating films IWL1 (the inter-electrode insulating films 15) provided between each of the multiple first electrode films WL1. In the description herein, the insulating film provided in contact with the upper face of the first electrode film WL1 of one end in the Z axis direction (the end in the upward direction) and the insulating film provided in contact with the lower face of the first electrode film WL1 of the other end in the Z axis direction (the end in the downward direction) also are taken to be first inter-electrode insulating films IWL1 included in the first stacked structural body Sa1 (the stacked body 19).

The second stacked structural body Sa2 includes multiple second electrode films WL2 aligned in the X axis direction and alternately stacked in the first direction with multiple second inter-electrode insulating films IWL2. In other words, the second stacked structural body Sa2 includes the multiple second electrode films WL2 aligned in the X axis direction and stacked in the Z axis direction and the multiple second inter-electrode insulating films IWL2 provided between each of the multiple second electrode films WL2. In the description in such a case as well, the insulating film provided in contact with the upper face of the second electrode film WL2 of the end in the upward direction and the insulating film provided in contact with the lower face of the second electrode film WL2 of the end in the downward direction are taken to be second inter-electrode insulating films IWL2 included in the second stacked structural body Sa2 (the stacked body 19).

The memory cell array unit MU of the nonvolatile semiconductor memory device 110 further includes a first selection gate electrode SGa1, a second selection gate electrode SGa2, a first semiconductor pillar SPa1, and a second semiconductor pillar SPa2.

The first selection gate electrode SGa1 is stacked with the first stacked structural body Sa1 along the Z axis direction to align in the X axis direction. For example, the first selection gate electrode SGa1 is stacked with the first stacked structural body Sa1 on the upper side of the first stacked structural body Sa1.

The second selection gate electrode SGa2 is stacked with the second stacked structural body Sa2 along the Z axis direction to align in the X axis direction. In other words, the second selection gate electrode SGa2 is aligned in the X axis direction and stacked with the second stacked structural body Sa2 along the Z axis direction on the side (in this example, the upper side) on which the first selection gate electrode SGa1 is stacked with the first stacked structural body Sa1.

The first semiconductor pillar SPa1 pierces the first stacked structural body Sa1 and the first selection gate electrode SGa1 in the Z axis direction. The second semiconductor pillar SPa2 pierces the second stacked structural body Sa2 and the second selection gate electrode SGa2 in the Z axis direction.

The memory cell array unit MU of the nonvolatile semiconductor memory device 110 further includes a first interconnection LL1 and a second interconnection LL2.

The first interconnection LL1 is connected to one end of the first semiconductor pillar SPa1 to align in a third direction orthogonal to the Z axis direction and intersecting the X axis direction. The second interconnection LL2 is connected to one end of the second semiconductor pillar SPa2 to align in the third direction recited above.

In this specific example, the third direction is orthogonal to the X axis direction. In other words, in this specific example, the third direction is taken to be the Y axis direction. However, this embodiment is not limited thereto. The third direction may not be orthogonal to the second direction (the X axis direction); and it is sufficient for the third direction to intersect (to be non-parallel to) the second direction (the X axis direction).

Thus, the one end (e.g., the upper end) of the first semiconductor pillar SPa1 is connected to the first interconnection LL1 aligned in the Y axis direction. The one end (e.g., the upper end) of the second semiconductor pillar SPa2 is connected to the second interconnection LL2 aligned in the Y axis direction.

The memory cell array unit MU of the nonvolatile semiconductor memory device 110 further includes a memory unit connection portion CPa (a connection member 32). The memory unit connection portion CPa (the connection member 32) connects the other end (e.g., the lower end) of the first semiconductor pillar SPa1 to the other end (e.g., the lower end) of the second semiconductor pillar SPa2. Thereby, a U-shaped silicon member 33 having a U-shaped configuration is formed of the first semiconductor pillar SPa1, the second semiconductor pillar SPa2, and the memory unit connection portion CPa. The U-shaped silicon member 33 functions as a memory string 38 having a U-shaped configuration.

The memory cell array unit MU of the nonvolatile semiconductor memory device 110 may further include a memory unit connection portion gate electrode 13a (the back gate 13) in contact with the memory unit connection portion CPa.

As illustrated in FIG. 2, the memory cell array unit MU of the nonvolatile semiconductor memory device 110 further includes a first memory layer ML1 (a charge storage layer 26) and a second memory layer ML2 (the charge storage layer 26). The first memory layer ML1 is provided between the first semiconductor pillar SPa1 and each of the multiple first electrode films WL1. The second memory layer ML2 is provided between the second semiconductor pillar SPa2 and each of the multiple second electrode films WL2.

Specifically, an inner insulating film 27 (the first inner insulating film) is provided between the first semiconductor pillar SPa1 and the first memory layer ML1; and an outer insulating film 25 (the first outer insulating film) is provided between the first memory layer ML1 and the multiple first electrode films WL1. Similarly, the inner insulating film 27 (the second inner insulating film) is provided between the second semiconductor pillar SPa2 and the second memory layer ML2; and the outer insulating film 25 (the second outer insulating film) is provided between the second memory layer ML2 and the multiple second electrode films WL2.

In this specific example, the charge storage layer 26 is provided also between the memory unit connection portion CPa and the memory unit connection portion gate electrode 13a; the inner insulating film 27 is provided between the memory unit connection portion CPa and the charge storage layer 26; and the outer insulating film 25 is provided between the memory unit connection portion gate electrode 13a and the charge storage layer 26.

As illustrated in FIG. 1 and FIG. 2, a semiconductor pillar SPa (e.g., the first semiconductor pillar SPa1 and the second semiconductor pillar SPa2) includes a lower silicon pillar 31 which is the portion piercing the stacked body 19 (e.g., the first stacked structural body Sa1 and the second stacked structural body Sat) and an upper silicon pillar 34 piercing a selection gate electrode 17 (e.g., the first selection gate electrode SGa1 and the second selection gate electrode SGa2). The upper end of the lower silicon pillar 31 and the lower end of the upper silicon pillar 34 are electrically connected to each other to form the semiconductor pillar SPa. The lower silicon pillar 31 and the memory unit connection portion CPa (the connection member 32) can be formed collectively by making through-holes in the stacked body 19 and filling a semiconductor into the through-holes.

The first semiconductor pillar SPa1, the second semiconductor pillar SPa2, and the memory unit connection portion CPa may include a semiconductor such as, for example, polysilicon or amorphous silicon.

The charge storage layer 26 may include, for example, silicon nitride. The inner insulating film 27 and the outer insulating film 25 may include, for example, silicon oxide. The inner insulating film 27 functions as, for example, a tunneling insulating film. The outer insulating film 25 functions as, for example, a blocking insulating film. The charge storage layer 26 stores charge and has a function of storing information. The outer insulating film 25, the charge storage layer 26, and the inner insulating film 27 form a memory unit film 24 (e.g., an ONO film).

A memory transistor forming a memory cell is formed at the intersection between the semiconductor pillar SPa (e.g., the first semiconductor pillar SPa1 and the second semiconductor pillar SPa2) and the electrode film 14 (e.g., the first electrode film WL1 and the second electrode film WL2).

The electrode film 14 (e.g., the first electrode film WL1 and the second electrode film WL2) functions as, for example, a word line. The first interconnection LL1 functions as, for example, a source line. The second interconnection LL2 functions as, for example, a bit line (the local bit line described below).

The first selection gate electrode SGa1 and the second selection gate electrode SGa2 function to select the first semiconductor pillar SPa1 and the second semiconductor pillar SPa2, respectively.

A gate insulating film 28 is provided between the first semiconductor pillar SPa1 and the first selection gate electrode SGa1 and between the second semiconductor pillar SPa2 and the second selection gate electrode SGa2.

The first selection gate electrode SGa1 and the second selection gate electrode SGa2 may include, for example, polysilicon including an impurity, amorphous silicon including an impurity, etc.

An insulating film 16 is provided between the stacked body 19 and the selection gate electrode 17. An insulating film 18 is provided between the selection gate electrode 17 and the first interconnection LL1 and between the selection gate electrode 17 and the second interconnection LL2.

Thus, in the nonvolatile semiconductor memory device 110 according to this embodiment, the pair of semiconductor pillars SPa (the first semiconductor pillar SPa1 and the second semiconductor pillar SPa2) connected to each other via the connection member 32 pierce mutually different electrode films 14 and mutually different selection gate electrodes 17. Each of the one ends (the upper ends) of the pair of semiconductor pillars SPa (the first semiconductor pillar SPa1 and the second semiconductor pillar SPa2) is connected to a different interconnection (the first interconnection LL1 and the second interconnection LL2), respectively. Each of the other ends (the lower ends) of the pair of semiconductor pillars SPa (the first semiconductor pillar SPa1 and the second semiconductor pillar SPa2) is connected to the memory unit connection portion CPa (the connection member 32).

The second direction, in which the electrode film 14 is aligned, intersects (is non-parallel to) (in this specific example, is orthogonal to) the third direction, in which the interconnections (the first interconnection LL1 and the second interconnection LL2) are aligned. The memory unit connection portion CPa (the connection member 32) is aligned in a direction oblique to the X axis direction.

In other words, in the memory cell array unit MU of the nonvolatile semiconductor memory device 110 as illustrated in FIG. 1 and FIG. 4, the connection member 32 connects two of the semiconductor pillars SPa positioned from each other along a direction oblique to both the second direction (the X axis direction), which is the alignment direction of the electrode film 14 and the selection gate electrode 17, and the third direction (in this example, the Y axis direction), which is the alignment direction of the interconnections (the first interconnection LL1 and the second interconnection LL2). The connection member 32 is aligned in a direction intersecting the second direction and the third direction.

As illustrated in FIG. 1, the U-shaped silicon member 33 (the memory string 38 having the U-shaped configuration) including the first semiconductor pillar SPa1, the second semiconductor pillar SPa2, and the memory unit connection portion CPa such as those recited above may be multiply provided repeatedly along the X axis direction and the Y axis direction. The first interconnection LL1 and the second interconnection LL2 may be multiply provided repeatedly along the X axis direction.

On the other hand, as illustrated in FIG. 1, the selection unit SU of the nonvolatile semiconductor memory device 110 includes a selection unit stacked structural body Sb, a selection unit selection gate electrode SGb, a first selection unit semiconductor pillar SPb1, a second selection unit semiconductor pillar SPb2, a third interconnection LL3, a fourth interconnection LL4, and a selection unit connection portion CPb.

As illustrated in FIG. 3, the selection unit stacked structural body Sb includes multiple selection unit electrode films WLb alternately stacked in the Z axis direction with multiple selection unit inter-electrode insulating films IWLb. In other words, the selection unit stacked structural body Sb includes the multiple selection unit electrode films WLb stacked in the Z axis direction and the multiple selection unit inter-electrode insulating films IWLb provided between each of the multiple selection unit electrode films WLb. The selection unit electrode film WLb is in the same layer as the electrode film 14 of the memory cell array unit MU. The conductive layer of the selection unit electrode film WLb is the same conductive layer used for the electrode film 14. The selection unit inter-electrode insulating film IWLb is in the same layer as the inter-electrode insulating film 15 of the memory cell array unit MU. The insulating layer of the selection unit inter-electrode insulating film IWLb is the same insulating layer used for the inter-electrode insulating film 15.

In the description for such a case as well, the insulating film provided in contact with the upper face of the one end of the selection unit electrode film WLb in the Z axis direction (the end in the upward direction) and the insulating film provided in contact with the lower face of the other end of the selection unit electrode film WLb in the Z axis direction (the end in the downward direction) are taken to be selection unit inter-electrode insulating films IWLb included in the selection unit stacked structural body Sb.

The selection unit selection gate electrode SGb is stacked with the selection unit stacked structural body Sb along the Z axis direction. Specifically, the selection unit selection gate electrode SGb is stacked with the selection unit stacked structural body Sb along the Z axis direction on the side (the upper side) on which the first selection gate electrode SGa1 is stacked on the first stacked structural body Sa1.

The first selection unit semiconductor pillar SPb1 and the second selection unit semiconductor pillar SPb2 pierce the selection unit stacked structural body Sb and the selection unit selection gate electrode SGb in the Z axis direction. In other words, in the selection unit SU, multiple selection unit semiconductor pillars SPb are provided to pierce the selection unit stacked structural body Sb and the selection unit selection gate electrode SGb in the Z axis direction. The selection unit semiconductor pillars SPb include the first selection unit semiconductor pillar SPb1 and the second selection unit semiconductor pillar SPb2. The number of the selection unit semiconductor pillars SPb may be three or more.

The third interconnection LL3 is aligned in the fourth direction orthogonal to the Z axis direction and is connected to the one end (e.g., the upper end) of the first selection unit semiconductor pillar SPb1. In other words, the third interconnection LL3 is provided on the same side of the selection unit stacked structural body Sb as the side on which the first selection gate electrode SGa1 is stacked with the first stacked structural body Sa1. In other words, the third interconnection LL3 is provided above the selection unit stacked structural body Sb.

The fourth interconnection LL4 is aligned in the fourth direction recited above, electrically connected to the second interconnection LL2, and connected to the one end (e.g., the upper end) of the second selection unit semiconductor pillar SPb2. In other words, the fourth interconnection LL4 is provided on the same side of the selection unit stacked structural body Sb as the side on which the first selection gate electrode SGa1 is stacked with the first stacked structural body Sa1. In other words, the fourth interconnection LL4 is provided above the selection unit stacked structural body Sb. The second selection unit semiconductor pillar SPb2 is electrically connected to the second interconnection LL2 via the fourth interconnection LL4.

For example, the distance between the third interconnection LL3 and the selection unit stacked structural body Sb is substantially equal to the distance between the first interconnection LL1 and the first stacked structural body Sa1. For example, the distance between the fourth interconnection LL4 and the selection unit stacked structural body Sb is substantially equal to the distance between the first interconnection LL1 and the first stacked structural body Sa1. In other words, the third interconnection LL3 and the fourth interconnection LL4 are in the same layer as the first interconnection LL1 (and the second interconnection LL2). For example, the conductive layer of the third interconnection LL3 and the fourth interconnection LL4 may be the same conductive layer used for the first interconnection LL1 (and the second interconnection LL2). Thereby, the productivity can be increased because the number of interconnection layers is not increased.

In this specific example, the fourth direction is parallel to the third direction. In other words, the fourth direction is the Y axis direction. However, this embodiment is not limited thereto. It is sufficient for the fourth direction to be orthogonal to the first direction.

In this specific example, the third interconnection LL3 is aligned in the third direction on an extension of the third direction of the first interconnection LL1 (in this specific example, the Y axis direction). In other words, the first interconnection LL1 and the third interconnection LL3 are an interconnection of the same layer divided from each other at the boundary between the memory cell array unit MU and the selection unit SU. However, this embodiment is not limited thereto. It is sufficient that the third interconnection LL3 is in the same layer as the first interconnection LL1 and is aligned in a direction in which the first interconnection LL1 is aligned (the third direction). The position of the third interconnection LL3 along the X axis direction is arbitrary.

As illustrated in FIG. 1, the second interconnection LL2 continues from the memory cell array unit MU to the selection unit SU and is aligned along the third direction (in this specific example, the Y axis direction). In other words, in this specific example, the second interconnection LL2 and the fourth interconnection LL4 are aligned in a straight line from the memory cell array unit MU to the selection unit SU and are connected in a straight line. In other words, the fourth interconnection LL4 is an extension of the second interconnection LL2; and the second interconnection LL2 and the fourth interconnection LL4 may be considered to be one interconnection. However, in this embodiment, it is sufficient for the second interconnection LL2 of the memory cell array unit MU and the fourth interconnection LL4 of the selection unit SU to be electrically connected to each other. The relationship between the alignment direction of the second interconnection LL2 and the alignment direction of the fourth interconnection LL4 is arbitrary. Also, the relationship between the position of the second interconnection LL2 along the X axis direction and the position of the fourth interconnection LL4 along the X axis direction is arbitrary.

Hereinbelow, the case is described where the third interconnection LL3 is provided along an extension of the alignment direction of the first interconnection LL1; and the fourth interconnection LL4 is provided along an extension of the alignment direction of the second interconnection LL2.

The selection unit connection portion CPb (the connection member 32) connects the other end (the lower end) of the first selection unit semiconductor pillar SPb1 to the other end (the lower end) of the second selection unit semiconductor pillar SPb2.

The selection unit SU further includes a selection unit connection portion gate electrode 13b (the back gate 13) in contact with the selection unit connection portion CPb.

The material of the first selection unit semiconductor pillar SPb1, the second selection unit semiconductor pillar SPb2, and the selection unit connection portion CPb may be substantially the same material used for the first semiconductor pillar SPa1, the second semiconductor pillar SPa2, and the memory unit connection portion CPa.

For example, the first selection unit semiconductor pillar SPb1, the second selection unit semiconductor pillar SPb2, and the selection unit connection portion CPb may include a semiconductor such as, for example, polysilicon or amorphous silicon.

The nonvolatile semiconductor memory device 110 further includes a fifth interconnection LL5. The fifth interconnection LL5 is aligned in the fifth direction orthogonal to the first direction (the Z axis direction) on the side (the upper side) of the third interconnection LL3 opposite to the selection unit stacked structural body Sb. The fifth interconnection LL5 is electrically connected to the third interconnection LL3. Specifically, the fifth direction is the Y axis direction. In other words, the fifth direction is parallel to the fourth direction and parallel to the third direction. That is, the fifth interconnection LL5 is parallel to the third interconnection LL3 (and the fourth interconnection LL4).

The third interconnection LL3 and the fifth interconnection LL5, for example, are electrically connected by a via electrode V01.

Although omitted in FIG. 1 for easier viewing, the fifth interconnection LL5 is aligned along the Y axis direction in the memory cell array unit MU as well. For example, the fifth interconnection LL5 is aligned along the Y axis direction above at least one selected from the first interconnection LL1 and the second interconnection LL2 of the memory cell array unit MU.

As illustrated in FIG. 1, the U-shaped silicon member 33 including the first selection unit semiconductor pillar SPb1, the second selection unit semiconductor pillar SPb2, and the selection unit connection portion CPb as recited above may be multiply provided repeatedly along the X axis direction and the Y axis direction. The third interconnection LL3 and the fourth interconnection LL4 may be multiply provided repeatedly along the X axis direction. The fifth interconnection LL5 may be multiply provided repeatedly along the X axis direction.

Thus, one fifth interconnection LL5 is provided for one set of the two interconnections, i.e., the third interconnection LL3 and the fourth interconnection LL4. The pitch of the third interconnection LL3 and the pitch of the fifth interconnection LL5 are substantially the same. In the case where the third interconnection LL3 and the fourth interconnection LL4 are taken as one interconnection member, the pitch of the interconnection member is substantially one-half of the pitch of the fifth interconnection LL5. In other words, the widths of the third interconnection LL3 and the fourth interconnection LL4 are about one-half of the width of the fifth interconnection LL5. Thus, the width of the fifth interconnection LL5 is substantially twice the width of the third interconnection LL3. Considering the fluctuation of manufacturing processes, etc., the width of the fifth interconnection LL5 along a direction orthogonal to the fifth direction (in this specific example, the X axis direction) can be not less than 1.5 times and not more than 2.5 times the width of the third interconnection LL3 along a direction orthogonal to the fourth direction (in this specific example, the X axis direction).

The spacing between the fifth interconnections LL5 can be not less than 1.5 times and not more than 2.5 times the spacing between the third interconnection LL3 and the fourth interconnection LL4.

In other words, the fifth interconnection LL5 may be multiply provided along a direction orthogonal to the fifth direction (in this specific example, the X axis direction); and the spacing between the multiple fifth interconnections LL5 can be not less than 1.5 times and not more than 2.5 times the spacing between the third interconnection LL3 and the fourth interconnection LL4.

In the memory cell array unit MU, in the case where the first interconnection LL1 and the second interconnection LL2 are taken as one interconnection member, the pitch of the interconnection member is substantially one-half of the pitch of the fifth interconnection LL5. In other words, the widths of the first interconnection LL1 and the second interconnection LL2 are about one-half of the width of the fifth interconnection LL5. In other words, the width of the fifth interconnection LL5 along a direction orthogonal to the fifth direction (in this specific example, the X axis direction) can be not less than 1.5 times and not more than 2.5 times the width of the first interconnection LL1 along the second direction (in this specific example, the X axis direction).

As illustrated in FIG. 1 and FIG. 3, in this specific example, the selection unit stacked structural body Sb may be divided into a third stacked structural body Sb1 aligned in the X axis direction and a fourth stacked structural body Sb2 aligned in the X axis direction. The third stacked structural body Sb1 includes multiple third electrode films WLb1 and multiple third inter-electrode insulating films IWLb1. The fourth stacked structural body Sb2 includes multiple fourth electrode films WLb2 and multiple fourth inter-electrode insulating films IWLb2.

In other words, the multiple selection unit electrode films WLb are divided into the multiple third electrode films WLb1 aligned in the X axis direction and the multiple fourth electrode films WLb2 aligned in the X axis direction. The multiple selection unit inter-electrode insulating films IWLb are divided into the multiple third inter-electrode insulating films IWLb1 provided between each of the multiple third electrode films WLb1 and the multiple fourth inter-electrode insulating films IWLb2 provided between each of the multiple fourth electrode films WLb2.

In such a case as well, the insulating film provided in contact with the upper face of the one end of the third electrode film WLb1 in the Z axis direction (the end in the upward direction) and the insulating film provided in contact with the lower face of the other end of the third electrode film WLb1 in the Z axis direction (the end in the downward direction) are taken to be third inter-electrode insulating films IWLb1 included in the third stacked structural body Sb1. The insulating film provided in contact with the upper face of the one end of the fourth electrode film WLb2 in the Z axis direction (the end in the upward direction) and the insulating film provided in contact with the lower face of the other end of the fourth electrode film WLb2 in the Z axis direction (the end in the downward direction) are taken to be fourth inter-electrode insulating films IWLb2 included in the fourth stacked structural body Sb2.

The selection unit selection gate electrode SGb is divided into a third selection gate electrode SGb1 stacked with the third stacked structural body Sb1 along the Z axis direction and aligned in the X axis direction and a fourth selection gate electrode SGb2 stacked with the fourth stacked structural body Sb2 along the Z axis direction and aligned in the X axis direction.

The first selection unit semiconductor pillar SPb1 pierces the third stacked structural body Sb1 and the third selection gate electrode SGb1 in the Z axis direction. The second selection unit semiconductor pillar SPb2 pierces the fourth stacked structural body Sb2 and the fourth selection gate electrode SGb2 along the Z axis direction.

Thus, in the nonvolatile semiconductor memory device 110 according to this embodiment, the pair of selection unit semiconductor pillars SPb (the first selection unit semiconductor pillar SPb1 and the second selection unit semiconductor pillar SPb2) connected to each other via the selection unit connection portion CPb (the connection member 32) pierce mutually different electrode films 14 and mutually different selection gate electrodes 17. Each of the one ends (the upper ends) of the pair of selection unit semiconductor pillars SPb (the first selection unit semiconductor pillar SPb1 and the second selection unit semiconductor pillar SPb2) is connected to a different interconnection (the third interconnection LL3 and the fourth interconnection LL4), respectively. Each of the other ends (the lower ends) of the pair of selection unit semiconductor pillars SPb (the first selection unit semiconductor pillar SPb1 and the second selection unit semiconductor pillar SPb2) is connected to the selection unit connection portion CPb (the connection member 32).

In other words, two of the selection unit semiconductor pillars SPb positioned along a direction oblique to both the X axis direction and the Y axis direction are connected to the connection member 32. The connection member 32 of the selection unit SU is aligned in a direction intersecting the second direction and the fourth direction. The pair of selection unit semiconductor pillars SPb and the selection unit connection portion CPb are included in the U-shaped silicon member 33. As described below, in the selection unit SU, the U-shaped silicon member 33 functions as a bit line selector 38b.

The alignment direction of the selection unit connection portion CPb is substantially parallel to the alignment direction of the memory unit connection portion CPa.

Thus, in this specific example, the design efficiency and the productivity are increased by the configuration and disposition of the U-shaped silicon member 33 of the selection unit SU being substantially similar to the configuration and disposition of the U-shaped silicon member 33 of the memory cell array unit MU.

However, the embodiment of the invention is not limited thereto. As described below, the configuration and disposition of the U-shaped silicon member 33 of the selection unit SU may be different from the configuration and disposition of the U-shaped silicon member 33 of the memory cell array unit MU.

As illustrated in FIG. 1, the nonvolatile semiconductor memory device 110 may further include a sixth interconnection LL6 connected to one end of the first interconnection LL1. The sixth interconnection LL6 is aligned, for example, in the second direction (the X axis direction). The sixth interconnection LL6 functions as, for example, a common source line SLc.

In the nonvolatile semiconductor memory device 110, for example, the common source line SLc is connected to the first interconnection LL1; and the first interconnection LL1 is connected to the upper end of the first semiconductor pillar SPa1 of the memory cell array unit MU. The upper end of the U-shaped silicon member 33 (the memory string 38 having the U-shaped configuration), which includes the first semiconductor pillar SPa1, the memory unit connection portion CPa, and the second semiconductor pillar SPa2, is connected to the second interconnection LL2 on the second semiconductor pillar SPa2 side. The second interconnection LL2 extends to the selection unit SU and is connected to the upper end of the second selection unit semiconductor pillar SPb2. The upper end of the U-shaped silicon member 33 (the bit line selector 38b), which includes the second selection unit semiconductor pillar SPb2, the selection unit connection portion CPb, and the first selection unit semiconductor pillar SPb1, is connected to the third interconnection LL3 on the first selection unit semiconductor pillar SPb1 side. The third interconnection LL3 is connected to the fifth interconnection LL5 by the via electrode VO1.

The interconnections of the memory cell array unit MU such as the first interconnections LL1 function as source lines SL.

Interconnections of the memory cell array unit MU such as the second interconnections LL2 and interconnections of the selection unit SU connected to the second interconnections LL2 such as the fourth interconnections LL4 function as local bit lines LBLa.

The third interconnection LL3 provided in the selection unit SU in the same layer as the first interconnection LL1 functions as a local bit line LBLb of the selection unit SU. On the other hand, the fifth interconnection LL5 provided in a layer above such interconnections functions as a global bit line GBL.

The U-shaped silicon member 33 of the memory cell array unit MU functions as the memory string 38 having the U-shaped configuration. In other words, the memory transistors provided at the intersections between the electrode films 14 and the first semiconductor pillar SPa1 and between the electrode films 14 and the second semiconductor pillar SPa2 function as memory cells. The selection gate electrode 17 of the memory cell array unit MU functions to select the semiconductor pillar SPa.

On the other hand, the U-shaped silicon member 33 of the selection unit SU functions as the bit line selector 38b to select the local bit lines LBLa and LBLb. In other words, the potentials applied to the selection unit selection gate electrodes SGb of the selection unit SU control a conduction or a non-conduction between the first selection unit semiconductor pillar SPb1 and the second selection unit semiconductor pillar SPb2 of the U-shaped silicon member 33 of the selection unit SU and control a conduction or a non-conduction between the fourth interconnection LL4 (i.e., the second interconnection LL2) and the third interconnection LL3. Thereby, the conduction or the non-conduction from the fifth interconnection LL5 to the second interconnection LL2, i.e., the local bit line LBLa of the memory cell array unit MU, is controlled.

Thus, in the memory cell array unit MU of this specific example, two of the semiconductor pillars SPa form one set and are connected at the lower portions by the memory unit connection portion CPa. The memory unit connection portion CPa is aligned in a direction oblique to the bit lines (the local bit line LBLa and the global bit line GBL) and oblique to the selection gate lines (e.g., the first selection gate electrode SGa1 and the second selection gate electrode SGa2). Two adjacent bit line interconnection layers (the first interconnection LL1 and the second interconnection LL2) form one set. The first interconnection LL1 functions as the source line SL; and the second interconnection LL2 functions as the local bit line LBLa. The multiple source lines SL are connected together at one end of the memory cell array unit MU; and the multiple source lines SL as an entirety are collected into a comb shape and connected to the common source line SLc.

The electrode films 14 (the multiple first electrode films WL1 and the multiple second electrode films WL2) forming the control gate electrodes of the memory cell array unit MU are aligned in a direction orthogonal to the bit lines (the local bit line LBLa and the global bit line GBL). To reduce the number of transistors for driving the control gate electrodes, the electrode films 14 (the multiple first electrode films WL1 and the multiple second electrode films WL2) forming the control gate electrodes may be connected together, for example, in comb-shaped configurations including every other one of the electrode films 14 in a block of the memory cell array unit MU.

The local bit line LBLa is divided into, for example, 100 to 1000 strings in the X axis direction and is connected to the global bit line GBL via the selection unit SU. In the selection unit SU as well, two of the selection unit semiconductor pillars SPb are connected by the selection unit connection portion CPb aligned in a direction oblique to the local bit line LBLa to form the U-shaped silicon member 33. The U-shaped silicon member 33 may be, for example, multiply arranged in a line.

In the nonvolatile semiconductor memory device 110 having such a configuration, a conductive material of the same layer may be used for the second interconnection LL2, the third interconnection LL3, and the fourth interconnection LL4 (the local bit lines LBLa and LBLb) and the first interconnection LL1 (the source line SL); and the bit lines can have a two-layer structure of the local bit lines LBLa and LBLb and the global bit line GBL (the fifth interconnection LL5) without increasing the number of interconnection layers. Thereby, high productivity and low cost can be realized.

As described above, the disposition pitch of the global bit line GBL is more relaxed than the disposition pitch of the set of the first interconnection LL1 (the source line SL) and the second interconnection LL2 (the local bit line LBLa) and the disposition pitch of the set of the third interconnection LL3 (the local bit line LBLb) and the fourth interconnection LL4 (the local bit line LBLa). Thereby, the inter-line capacitance between the global bit lines GBL is reduced and the stability of the reading operation is increased. Also, a high reading operation speed can be realized.

Because the pitch of the fifth interconnections LL5 (the global bit lines GBL) is relaxed, the formation of the via electrode VO1 to electrically connect the third interconnection LL3 to the fifth interconnection LL5 is easy and the productivity increases.

Because the first semiconductor pillar SPa1 and the second semiconductor pillar SPa2 are connected to the first interconnection LL1 and the second interconnection LL2, respectively, of the same layer, it is unnecessary to form fine contact electrodes having high aspect ratios in the memory cell array unit MU; and this also enables higher productivity.

Moreover, the selecting operation of the local bit lines LBLa and LBLb is stabilized because the U-shaped silicon member 33 having two of the selection unit semiconductor pillars SPb as a set is used in the selection unit SU.

While a high breakdown voltage transistor corresponding to the high voltage applied during the erasing operation is formed in the case where a selector for selecting the local bit lines LBLa and LBLb is provided, for example, on the silicon substrate surface, in such a case, the surface area occupied by the selector increases.

In the case where semiconductor pillars are used as the selectors to select the local bit lines LBLa and LBLb, it is desirable to connect several to about ten semiconductor pillars in parallel so the reading current value does not decrease. In the case where, for example, a configuration is used in which many selection unit semiconductor pillars SPb in the selection unit SU are connected in parallel by one connection portion, the necessary chip surface area becomes relatively large and one common connection portion is used. Therefore, the parasitic resistance of the connection portion becomes dominant; and in some cases, the operations may become unstable.

Conversely, in the nonvolatile semiconductor memory device 110 of this specific example, the selection unit semiconductor pillars SPb can be connected in parallel in a small chip surface area. Therefore, instability of the operations due to the parasitic resistance of the connection portion is suppressed.

Also, in this specific example, the configuration applied to the selection unit connection portion CPb of the selection unit SU is similar to the configuration of the memory unit connection portion CPa of the memory cell array unit MU. Therefore, the design efficiency increases; and this contributes to higher yields.

Thus, according to the nonvolatile semiconductor memory device 110 according to this embodiment, a nonvolatile semiconductor memory device enabling higher productivity and operational stability can be provided.

Although the multiple selection unit semiconductor pillars SPb are provided for the third interconnection LL3 and the fourth interconnection LL4 in this specific example, one selection unit semiconductor pillar SPb may be provided for each of the third interconnection LL3 and the fourth interconnection LL4.

An example of the overview of operations of the nonvolatile semiconductor memory device 110 will now be described.

Figure 5:
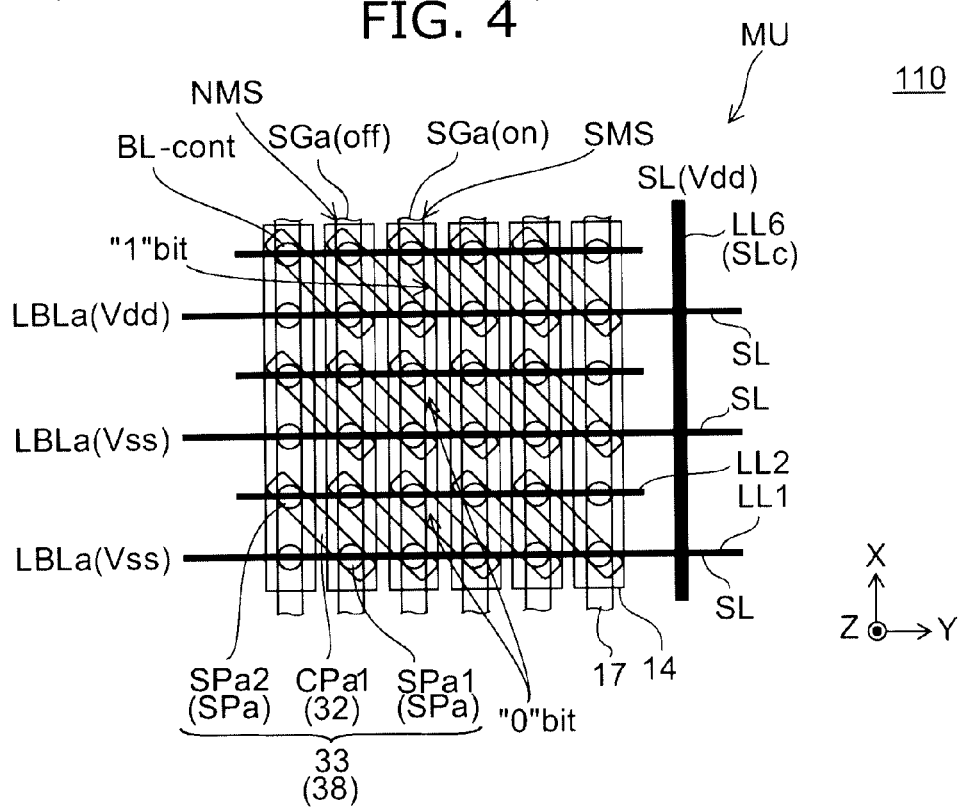
FIG. 5 is a schematic view of operations of the nonvolatile semiconductor memory device according to the first embodiment.

FIG. 5 is a schematic view illustrating operations of the nonvolatile semiconductor memory device according to the first embodiment.

Namely, FIG. 5 illustrates a writing operation of the nonvolatile semiconductor memory device 110.

In the writing operation as illustrated in FIG. 5, first, for example, all of the local bit lines LBLa (the second interconnections LL2) and the source lines SL (the first interconnections LL1) are set to a low voltage Vss (e.g., 0 volts); and the memory unit connection portion gate electrode 13a of the memory unit connection portion CPa is set to an OFF state ("off," e.g., 0 volts).

Then, selection gate electrodes SGa (the selection gate electrodes 17) connected to writing strings SMS to which the writing is performed are set to an ON state ("on," e.g., 3 volts). The body potentials of non-writing strings NMS connected to the other selection gate electrodes SGa (the other selection gate electrodes 17) are in a floating state. During the writing operation, the selectors (the bit line selectors 38b) included in the selection unit SU may constantly be in the ON state.

Continuing, the source line SL is set to a high level (e.g., an intermediate voltage Vdd).

Then, the global bit lines GBL (i.e., the local bit lines LBLa and LBLb) other than the bit lines connected to the "0" bit strings to which the "0" writing is performed are set to the high level. Thereby, the body potentials of the "1" bit strings to which the writing of "1" is performed (the strings to which the writing of "0" is not performed) are cutoff from the global bit line GBL and are in the floating state.

By the operations recited above, the body potentials of only the "0" bit strings to which the writing of "0" is performed are fixed at the low voltage Vss. From this state, after increasing the control gate electrodes (the electrode films 14) of each layer to a pass voltage Vpass (e.g., 8 volts), the control gate electrodes of the layers in which the cells to which the writing of "0" is performed are actually connected are increased to a writing voltage Vpgm (e.g., 18 volts). Thereby, a writing of "0" is performed on the desired writing memory cells.

Thus, the desired writing operation can be realized even though two of the semiconductor pillars SPa are connected by the memory unit connection portion CPa aligned in a direction oblique to the X axis direction by setting the potentials to the high level for the control gate electrodes (the electrode films 14) formed in line configurations and the source lines SL connected together and by setting all of the selection transistors connected to the source lines SL to the OFF state.

Figure 6:
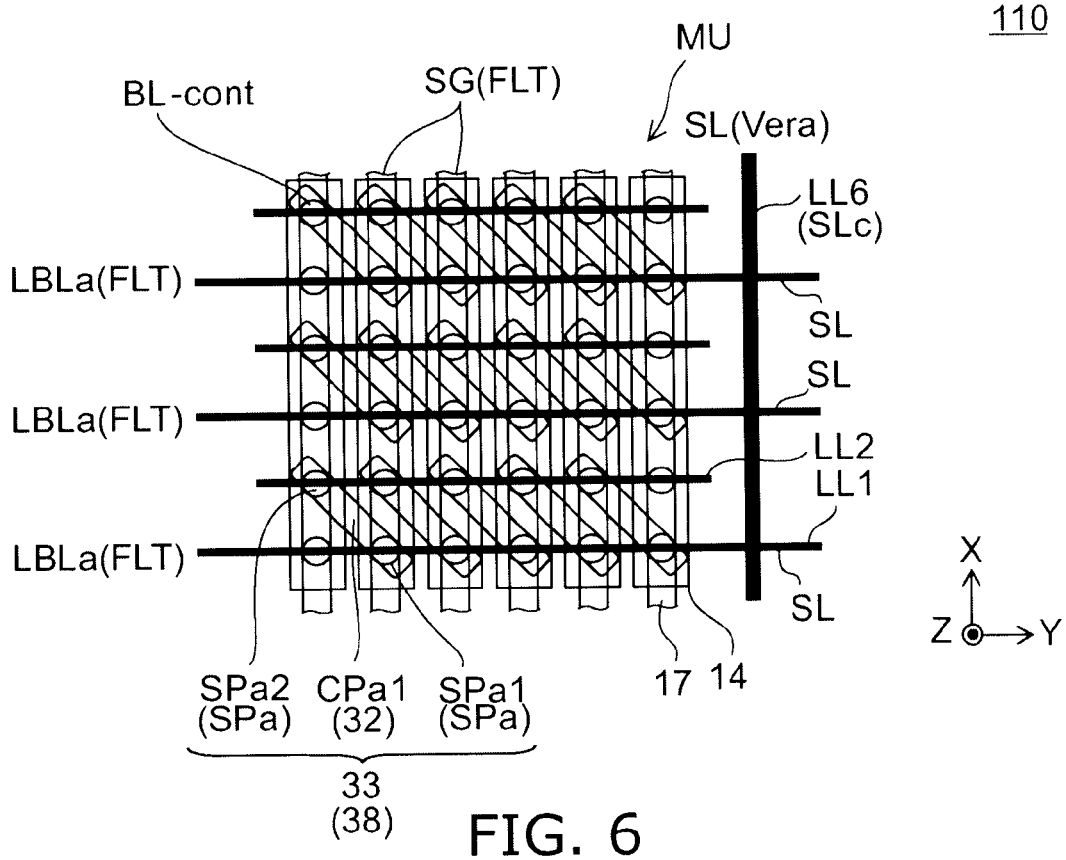
FIG. 6 is a schematic view of operations of the nonvolatile semiconductor memory device according to the first embodiment.

FIG. 6 is a schematic view illustrating operations of the nonvolatile semiconductor memory device according to the first embodiment.

Namely, FIG. 6 illustrates an erasing operation of the nonvolatile semiconductor memory device 110. The erasing is performed, for example, by erasing block.

As illustrated in FIG. 6, the control gate electrodes (the electrode films 14) of the erasing block are fixed at the low voltage Vss; and in this state, the increase of the potential of the source lines SL toward an erasing voltage Vera is started. Subsequently thereto, the potential of the selection gate electrodes 17 of the erasing block is caused to follow the potential of the source lines SL; holes are produced at the diffusion layer edge of the selection gate electrode 17 by a strong electric field; and the body potential is increased. In the blocks not erased, the control gate electrodes (the electrode films 14) are in a floating state FLT such that erasing stress is not applied to the memory cells. The local bit lines LBLa and the selector transistors of the selection unit SU are cutoff from the respective driver transistors and set to the floating state FLT.

Then, the body potential finally increases near the erasing voltage Vera; and the memory cells of the erasing block are erased.

Although the memory unit connection portion gate electrode 13a of the memory unit connection portion CPa recited above may be set to the OFF state (the low voltage Vss), in the case where it is particularly desirable not to apply erasing stress, a voltage of about the intermediate voltage Vdd may be applied beforehand. Thereby, a large erasing stress can be prevented from being applied while the hole current is conducted. Particularly during the erasing, the voltage is set such that a voltage exceeding the breakdown voltage of the gate insulating film 28 of the selection gate transistor is not applied.

Figure 7:
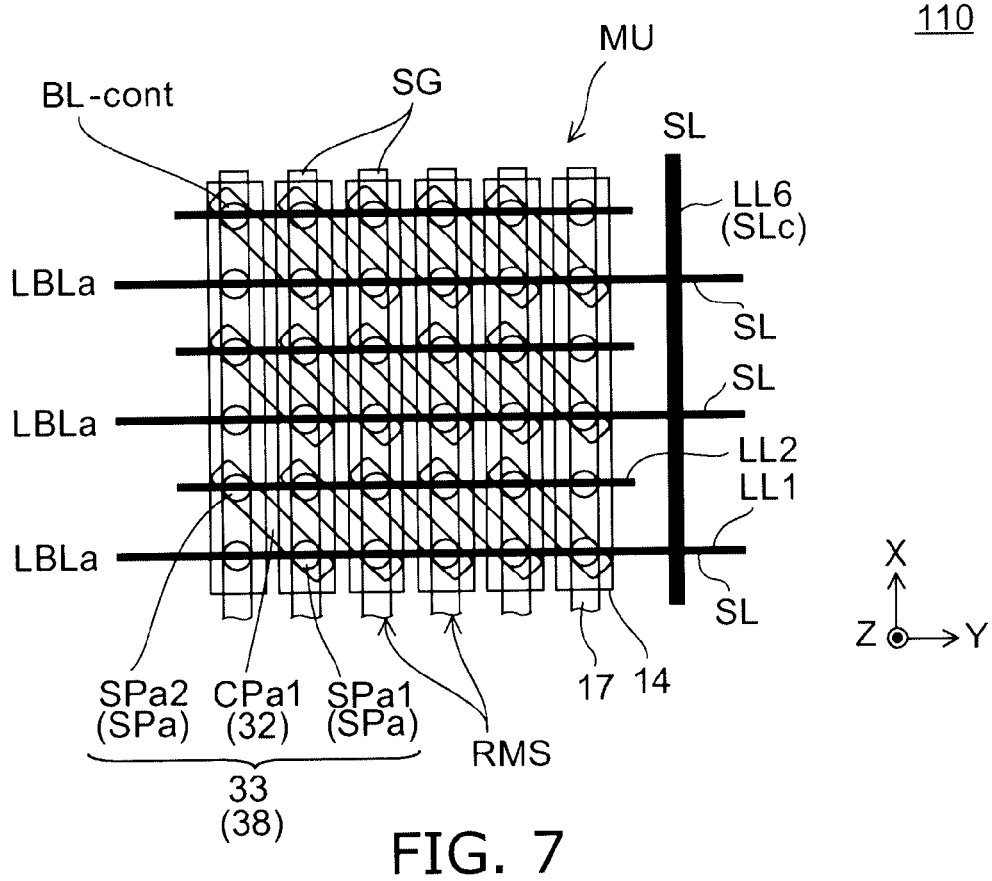
FIG. 7 is a schematic view of operations of the nonvolatile semiconductor memory device according to the first embodiment.

FIG. 7 is a schematic view illustrating operations of the nonvolatile semiconductor memory device according to the first embodiment.

Namely, FIG. 7 illustrates a reading operation of the nonvolatile semiconductor memory device 110.

As illustrated in FIG. 7, for example, first, all of the global bit lines GBL and the source lines SL are set to the low voltage Vss; and the memory unit connection portion gate electrode 13a controlling the memory unit connection portion CPa is set to the ON state.

Then, after setting all of the selection gate electrodes 17 to the OFF state, the selector transistors (the bit line selectors 38b) of the selection unit SU that control the connection between the global bit lines GBL and the local bit lines LBLa connected to the semiconductor pillars SPa including the reading cells are set to the ON state. The potentials of the control gate electrodes (the electrode films 14) of the selected cells are set to the low voltage Vss; and the potentials of the control gate electrodes (the electrode films 14) of the other layers are increased to a reading voltage Vread.

Further, the potentials of the global bit lines GBL are increased to a bit line voltage Vd_read during the reading; and the potentials of the global bit lines GBL (the local bit lines LBLa) increase to the bit line voltage Vd_read during the reading while the source lines SL remain set at the low voltage Vss. The selection gate electrodes 17 on the sides of the local bit line LBLa and the source line SL connected to the U-shaped silicon members 33 (the memory strings 38 having U-shaped configurations) including the reading cells are set to the ON state; and the data of the selected cells can be read by detecting the current flowing in the global bit lines GBL or the voltage of the global bit lines GBL.

Thus, it is possible to read any memory cell during the reading operation by setting the memory unit connection portion gate electrode 13a to the ON state and by setting the U-shaped silicon member 33 (the memory string 38 having an U-shaped configuration) to a state of conducting the current flowing through the path of the global bit line GBL, the local bit line LBLb, the local bit line LBLa, the U-shaped silicon member 33 (the memory string 38), and the source line SL.

Because two of the semiconductor pillars SPa are connected in the oblique direction, the body potentials of the U-shaped silicon members 33 (the memory strings 38) adjacent to each of the semiconductor pillars SPa fluctuate when the two selection gate electrodes 17 are set to the ON state. However, the unselected memory strings 38 always have one of the selection gates in the OFF state; and the flow of current in the unselected memory strings 38 is suppressed. Therefore, the operations during the reading are not affected.

Figure 8:
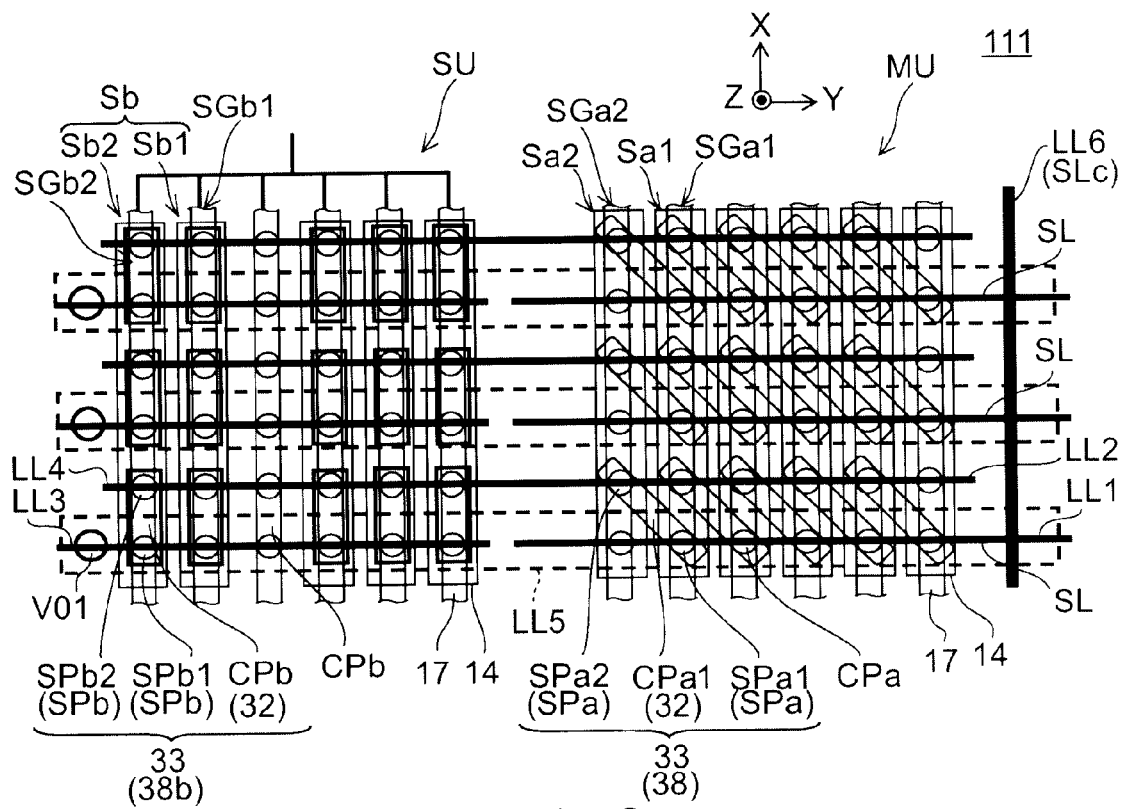
FIG. 8 is a schematic plan view of the configuration of another nonvolatile semiconductor memory device according to the first embodiment.

FIG. 8 is a schematic plan view illustrating the configuration of another nonvolatile semiconductor memory device according to the first embodiment.

In a nonvolatile semiconductor memory device 111 according to this embodiment as illustrated in FIG. 8, the configuration of the U-shaped silicon member 33 (the first selection unit semiconductor pillar SPb1, the second selection unit semiconductor pillar SPb2, and the selection unit connection portion CPb) of the selection unit SU differs from that of the nonvolatile semiconductor memory device 110. Otherwise, the configuration is similar to that of the nonvolatile semiconductor memory device 110.

In the nonvolatile semiconductor memory device 111, the first selection unit semiconductor pillar SPb1 and the second selection unit semiconductor pillar SPb2 are arranged along the X axis direction. The selection unit connection portion CPb connecting the first selection unit semiconductor pillar SPb1 and the second selection unit semiconductor pillar SPb2 is aligned in the X axis direction. In other words, the alignment direction of the selection unit connection portion CPb is substantially parallel to the second direction.

Such a U-shaped silicon member 33 (the first selection unit semiconductor pillar SPb1, the second selection unit semiconductor pillar SPb2, and the selection unit connection portion CPb) is multiply provided repeatedly along the X axis direction and the Y axis direction.

In the memory cell array unit MU of the nonvolatile semiconductor memory device 111 as well, the first semiconductor pillar SPa1 and the second semiconductor pillar SPa2 pierce mutually different stacked structural bodies (the first stacked structural body Sa1 and the second stacked structural body Sa2) and mutually different interconnections (the first interconnection LL1 and the second interconnection LL2). Therefore, the first semiconductor pillar SPa1 and the second semiconductor pillar SPa2 are positioned along a direction oblique to the X axis direction and the Y axis direction. Therefore, the memory unit connection portion CPa is aligned in the direction oblique to the X axis direction and the Y axis direction.

On the other hand, in the selection unit SU of the nonvolatile semiconductor memory device 111, as long as the first selection unit semiconductor pillar SPb1 and the second selection unit semiconductor pillar SPb2 pierce mutually different interconnections (the third interconnection LL3 and the fourth interconnection LL4), the relationship of the disposition of the first selection unit semiconductor pillar SPb1 and the second selection unit semiconductor pillar SPb2 and the alignment direction of the selection unit connection portion CPb are arbitrary.

According to the nonvolatile semiconductor memory device 111 as well, a nonvolatile semiconductor memory device enabling increased productivity and operational stability can be provided.

Figure 9:
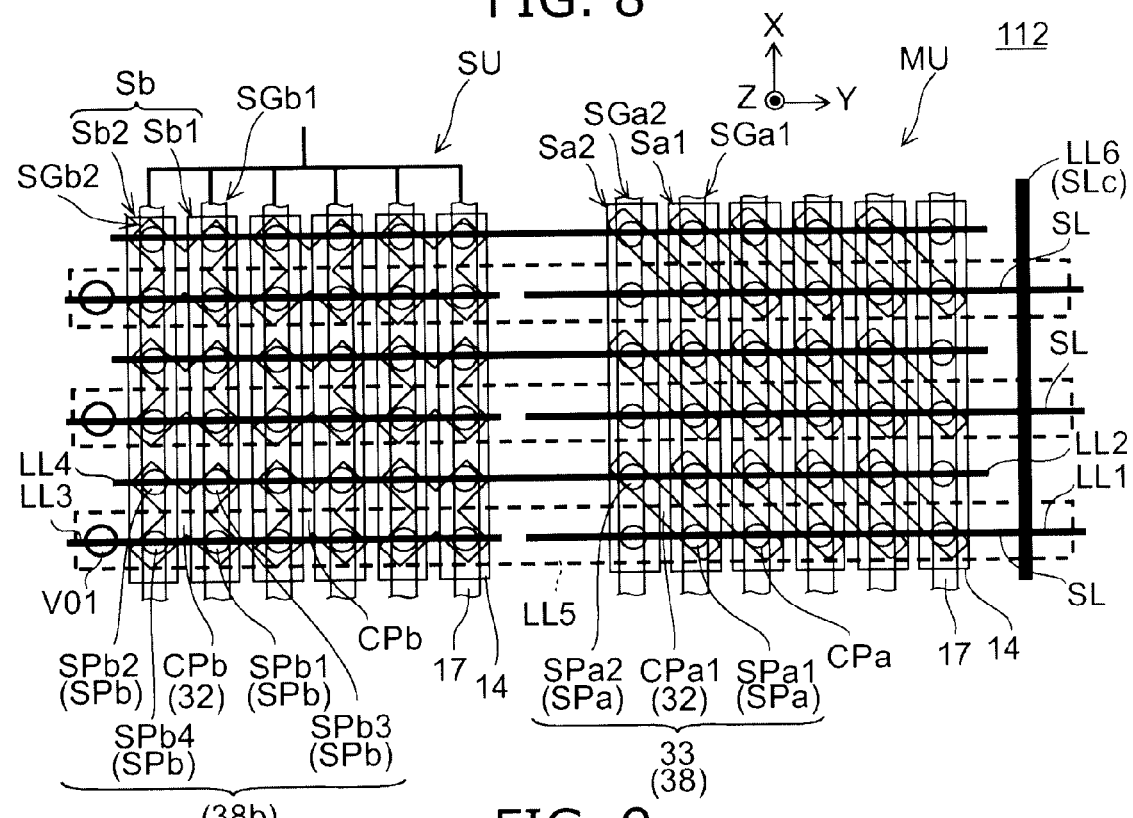
FIG. 9 is a schematic plan view of the configuration of another nonvolatile semiconductor memory device according to the first embodiment.

FIG. 9 is a schematic plan view illustrating the configuration of another nonvolatile semiconductor memory device according to the first embodiment.

In a nonvolatile semiconductor memory device 112 according to this embodiment as illustrated in FIG. 9, the configuration of the U-shaped silicon member 33 (the first selection unit semiconductor pillar SPb1, the second selection unit semiconductor pillar SPb2, and the selection unit connection portion CPb) of the selection unit SU differs from that of the nonvolatile semiconductor memory device 110. Otherwise, the configuration is similar to that of the nonvolatile semiconductor memory device 110.

In addition to the first selection unit semiconductor pillar SPb1 and the second selection unit semiconductor pillar SPb2 illustrated in FIG. 4, the nonvolatile semiconductor memory device 112 includes a third selection unit semiconductor pillar SPb3 and a fourth selection unit semiconductor pillar SPb4 for a total of four selection unit semiconductor pillars SPb connected by one selection unit connection portion CPb.

In this specific example, the third selection unit semiconductor pillar SPb3 is adjacent to the first selection unit semiconductor pillar SPb1 along the X axis direction. The fourth selection unit semiconductor pillar SPb4 is adjacent to the first selection unit semiconductor pillar SPb1 along the Y axis direction. The second selection unit semiconductor pillar SPb2 is adjacent to the third selection unit semiconductor pillar SPb3 along the Y axis direction and adjacent to the fourth selection unit semiconductor pillar SPb4 along the X axis direction.

The selection unit connection portion CPb includes two portions aligned in two intersecting directions, that is, the direction from the first selection unit semiconductor pillar SPb1 toward the second selection unit semiconductor pillar SPb2 and the direction from the third selection unit semiconductor pillar SPb3 toward the fourth selection unit semiconductor pillar SPb4.

In other words, the nonvolatile semiconductor memory device 112 further includes: the third selection unit semiconductor pillar SPb3 that pierces the selection unit stacked structural body Sb and the selection unit selection gate electrode SGb in the Z axis direction, is adjacent to the first selection unit semiconductor pillar SPb1 along a direction (in this specific example, the X axis direction) intersecting the fourth direction, and has one end connected to the fourth interconnection LL4; the fourth selection unit semiconductor pillar SPb4 that pierces the selection unit stacked structural body Sb and the selection unit selection gate electrode SGb in the Z axis direction, is adjacent to the first selection unit semiconductor pillar SPb1 along the fourth direction (the Y axis direction), is adjacent to the second selection unit semiconductor pillar SPb2 along a direction (the X axis direction) intersecting the fourth direction, and has one end connected to the third interconnection LL3; and an intersecting connection portion CPbc that intersects the selection unit connection portion CPb and connects the other end of the third selection unit semiconductor pillar SPb3 to the other end of the fourth selection unit semiconductor pillar SPb4.

In other words, in this specific example, the selection unit SU has a configuration in which two of the bit line selectors 38b having U-shaped configurations are combined.

According to the nonvolatile semiconductor memory device 112 as well, a nonvolatile semiconductor memory device enabling increased productivity and operational stability can be provided.

When connecting the first to fourth selection unit semiconductor pillars SPb1 to SPb4, although a connection member 32 having a rectangle configuration as viewed from the Z axis direction enables easy electrical switching at the peripheral portions of the rectangular connection member 32 when the connection member 32 connects the lower ends of the first to fourth selection unit semiconductor pillars SPb1 to SPb4, it is difficult to perform electrical switching at the central portion of the rectangular connection member 32. Therefore, as in the nonvolatile semiconductor memory device 112 illustrated in FIG. 9, it is favorable for the configuration of the selection unit connection portion CPb as viewed from the Z axis direction to be slender along the regions aligned to connect the selection unit semiconductor pillars SPb to each other while including the selection unit semiconductor pillars SPb to be connected.

For example, in the nonvolatile semiconductor memory devices 110, 111, and 120 (described below) in which two of the selection unit semiconductor pillars SPb are connected, it is desirable for the width of the selection unit connection portion CPb along a direction orthogonal to the direction from the first selection unit semiconductor pillar SPb1 toward the second selection unit semiconductor pillar SPb2 to be less than the pitch of the selection unit semiconductor pillars SPb along the Y axis direction. It is more desirable for the width of the selection unit connection portion CPb along the direction recited above to be less than two-thirds of the pitch of the selection unit semiconductor pillars SPb along the Y axis direction. It is favorable for the width of the selection unit connection portion CPb along the direction recited above to be equal to the diameter of the semiconductor pillar SP.

In other words, it is desirable for the width of the selection unit connection portion CPb along the direction recited above to be less than the distance along the fourth direction from the center of the first selection unit semiconductor pillar SPb1 along the fourth direction (in this specific example, the Y axis direction) to the center of the second selection unit semiconductor pillar SPb2 along the fourth direction; and more desirably, less than two-thirds of the distance.

For example, it is desirable for this relationship to be satisfied also in the nonvolatile semiconductor memory device 112 in which four of the selection unit semiconductor pillars SPb are connected to each other.

It is desirable for the width of the intersecting connection portion CPbc along a direction orthogonal to the direction from the third selection unit semiconductor pillar SPb3 toward the fourth selection unit semiconductor pillar SPb4 to be less than the distance along the fourth direction from the center of the third selection unit semiconductor pillar SPb3 along the fourth direction (in this specific example, the Y axis direction) to the center of the fourth selection unit semiconductor pillar SPb4 along the fourth direction; and more desirably, less than two-thirds of the distance.

Second Embodiment

Figure 10:
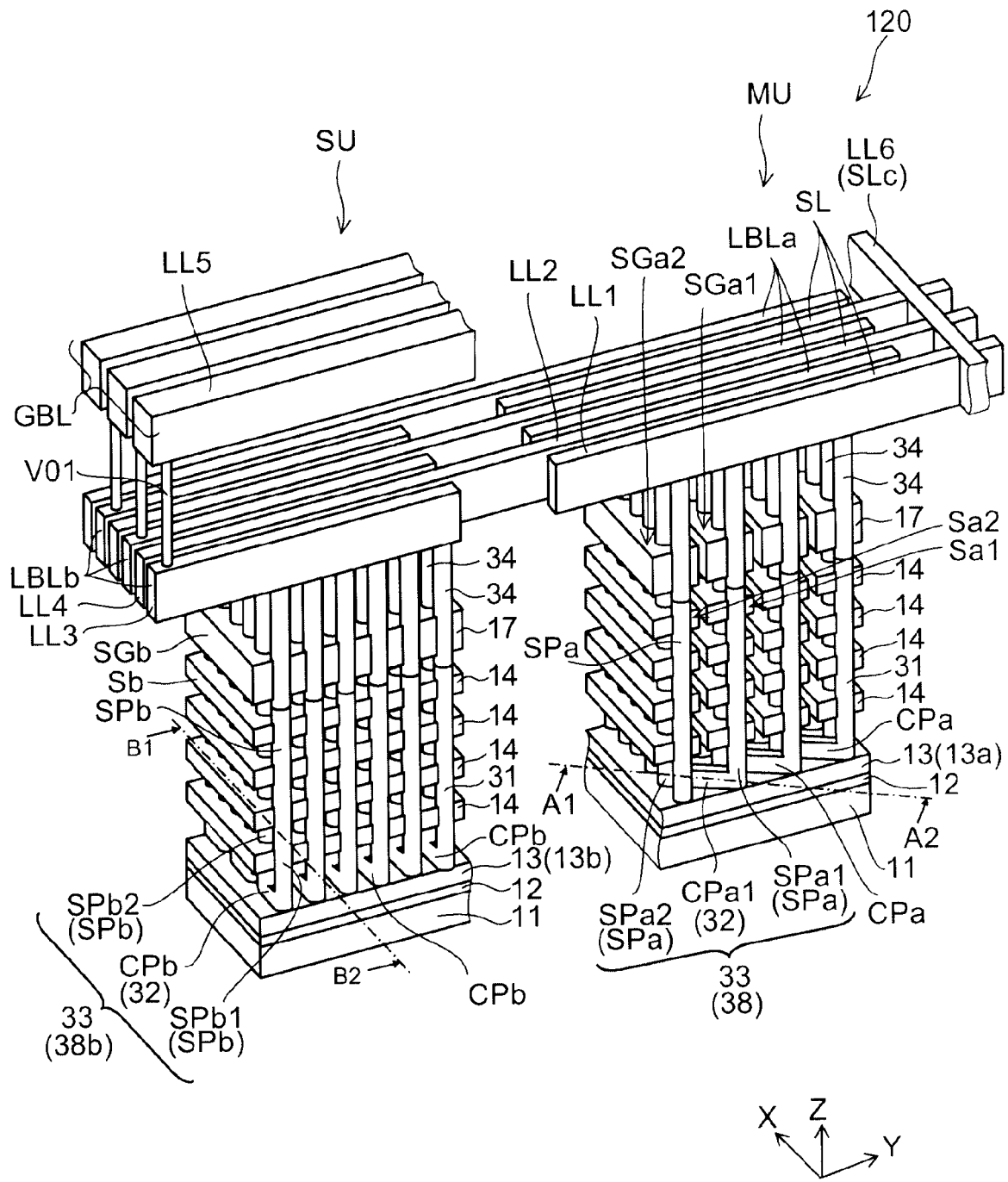
FIG. 10 is a schematic perspective view of the configuration of a nonvolatile semiconductor memory device according to a second embodiment.

FIG. 10 is a schematic perspective view illustrating the configuration of a nonvolatile semiconductor memory device according to a second embodiment.

Figure 11:
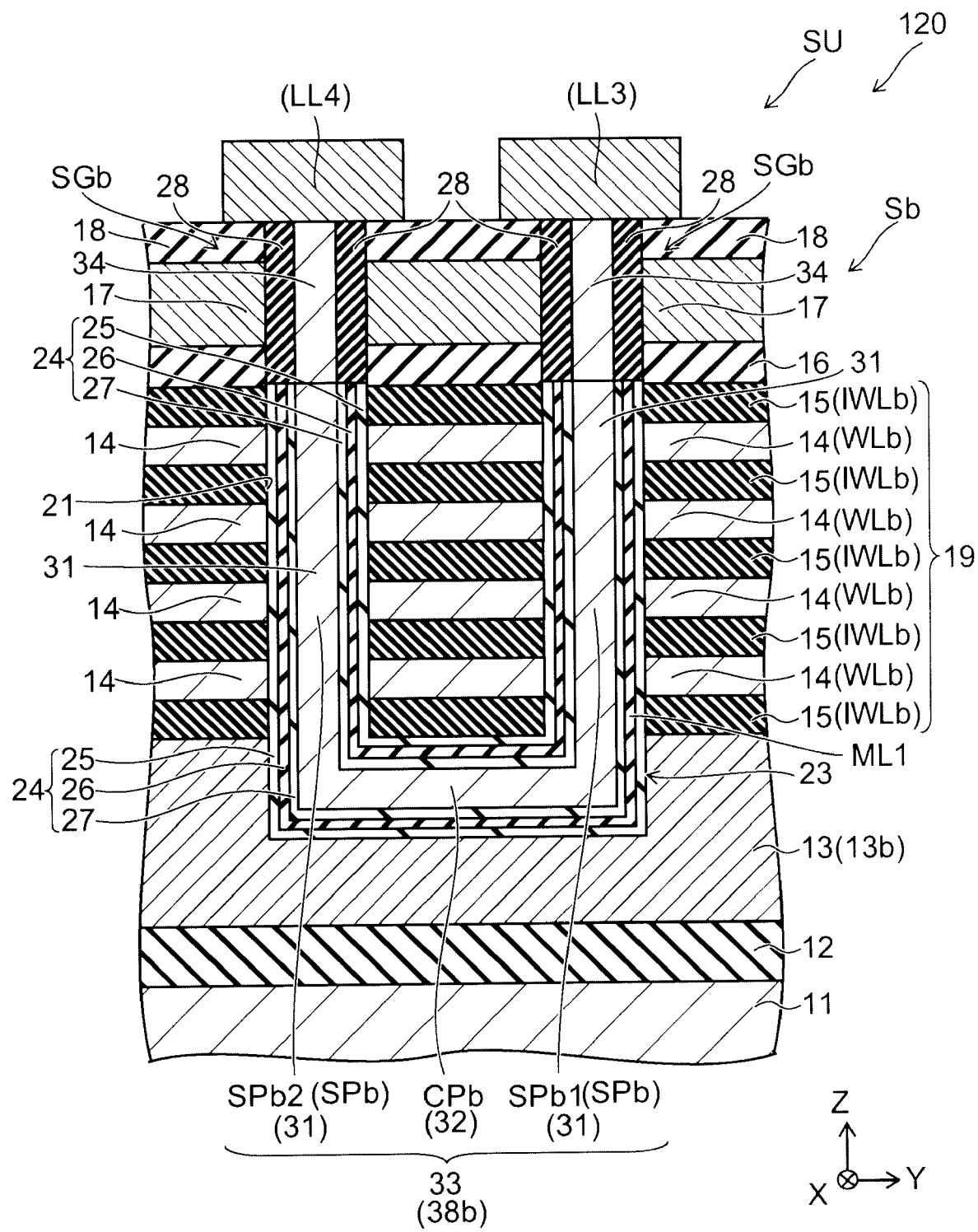
FIG. 11 is a schematic cross-sectional view of the configuration of a portion of the nonvolatile semiconductor memory device according to the second embodiment.

FIG. 11 is a schematic cross-sectional view illustrating the configuration of a portion of the nonvolatile semiconductor memory device according to the second embodiment. Namely, FIG. 11 is a cross-sectional view along line B1-B2 of FIG. 10.

Figure 12:
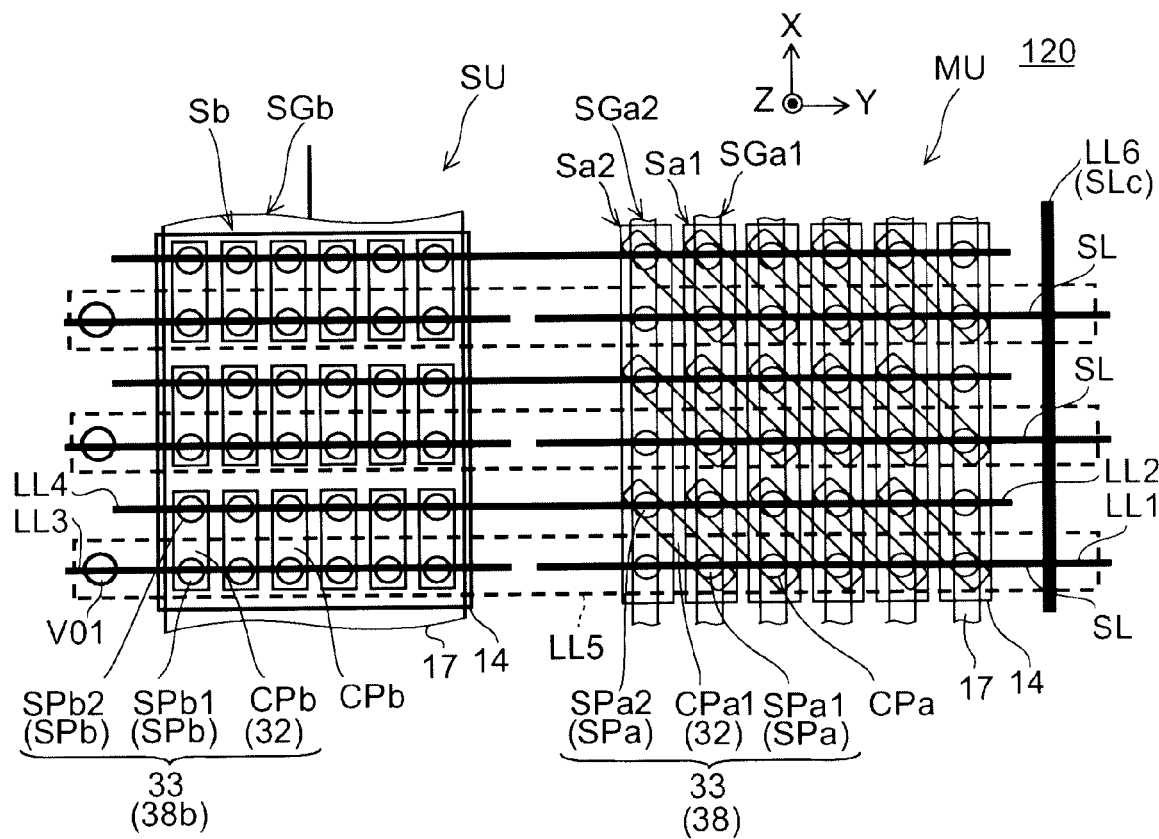
FIG. 12 is a schematic plan view of the configuration of the nonvolatile semiconductor memory device according to the second embodiment.

FIG. 12 is a schematic plan view illustrating the configuration of the nonvolatile semiconductor memory device according to the second embodiment.

The memory cell array unit MU of a nonvolatile semiconductor memory device 120 according to this embodiment as illustrated in FIG. 10 is similar to that of the nonvolatile semiconductor memory device 110. For example, the configuration of the cross section along line A1-A2 of FIG. 10 is similar to that of FIG. 2; and a description thereof is therefore omitted.

The configuration of the selection unit SU of the nonvolatile semiconductor memory device 120 differs from that of the nonvolatile semiconductor memory device 110. Namely, in this specific example, the selection unit electrode film WLb and the selection unit selection gate electrode SGb provided in the selection unit SU are not divided.

As illustrated in FIG. 10 to FIG. 12, the first selection unit semiconductor pillar SPb1 connected to the third interconnection LL3 and the second selection unit semiconductor pillar SPb2 connected to the fourth interconnection LL4 are adjacent along the X axis direction. The lower end of the first selection unit semiconductor pillar SPb1 and the lower end of the second selection unit semiconductor pillar SPb2 are connected to each other by the selection unit connection portion CPb aligned in the X axis direction. Thereby, the U-shaped silicon member 33 is formed.

Such a U-shaped silicon member 33 is multiply provided repeatedly along the X axis direction and the Y axis direction.

According to the nonvolatile semiconductor memory device 120 as well, a nonvolatile semiconductor memory device enabling increased productivity and operational stability can be provided.

By not dividing the selection unit electrode film WLb and the selection unit selection gate electrode SGb provided in the selection unit SU as in the nonvolatile semiconductor memory device 120, an advantage is provided that the surface area occupied by the selection unit SU can be reduced.

Various modifications of the configuration of the selection unit SU are possible even in the case where the selection unit electrode film WLb and the selection unit selection gate electrode SGb are not divided as in the nonvolatile semiconductor memory device 120.

For example, in the case where the selection unit electrode film WLb and the selection unit selection gate electrode SGb are not divided, it is also possible for the first selection unit semiconductor pillar SPb1 and the second selection unit semiconductor pillar SPb2 positioned along a direction oblique to the X axis direction and the Y axis direction to be connected by the selection unit connection portion CPb as illustrated in FIG. 4.

In the case where the selection unit electrode film WLb and the selection unit selection gate electrode SGb are not divided, it is also possible for the first to fourth selection unit semiconductor pillars SPb1 to SPb4 to be connected by the selection unit connection portion CPb having two portions aligned in two intersecting directions, that is, the direction from the first selection unit semiconductor pillar SPb1 toward the second selection unit semiconductor pillar SPb2 and the direction from the third selection unit semiconductor pillar SPb3 toward the fourth selection unit semiconductor pillar SPb4 as illustrated in FIG. 9.

Although the multiple U-shaped silicon members 33 are provided for one set of the third interconnection LL3 and the fourth interconnection LL4 in the nonvolatile semiconductor memory devices 110, 111, 112, and 120 recited above, it is sufficient for at least one U-shaped silicon member 33 (the first selection unit semiconductor pillar SPb1, the second selection unit semiconductor pillar SPb2, and the selection unit connection portion CPb) to be provided for the one set of the third interconnection LL3 and the fourth interconnection LL4.

Figure 13:
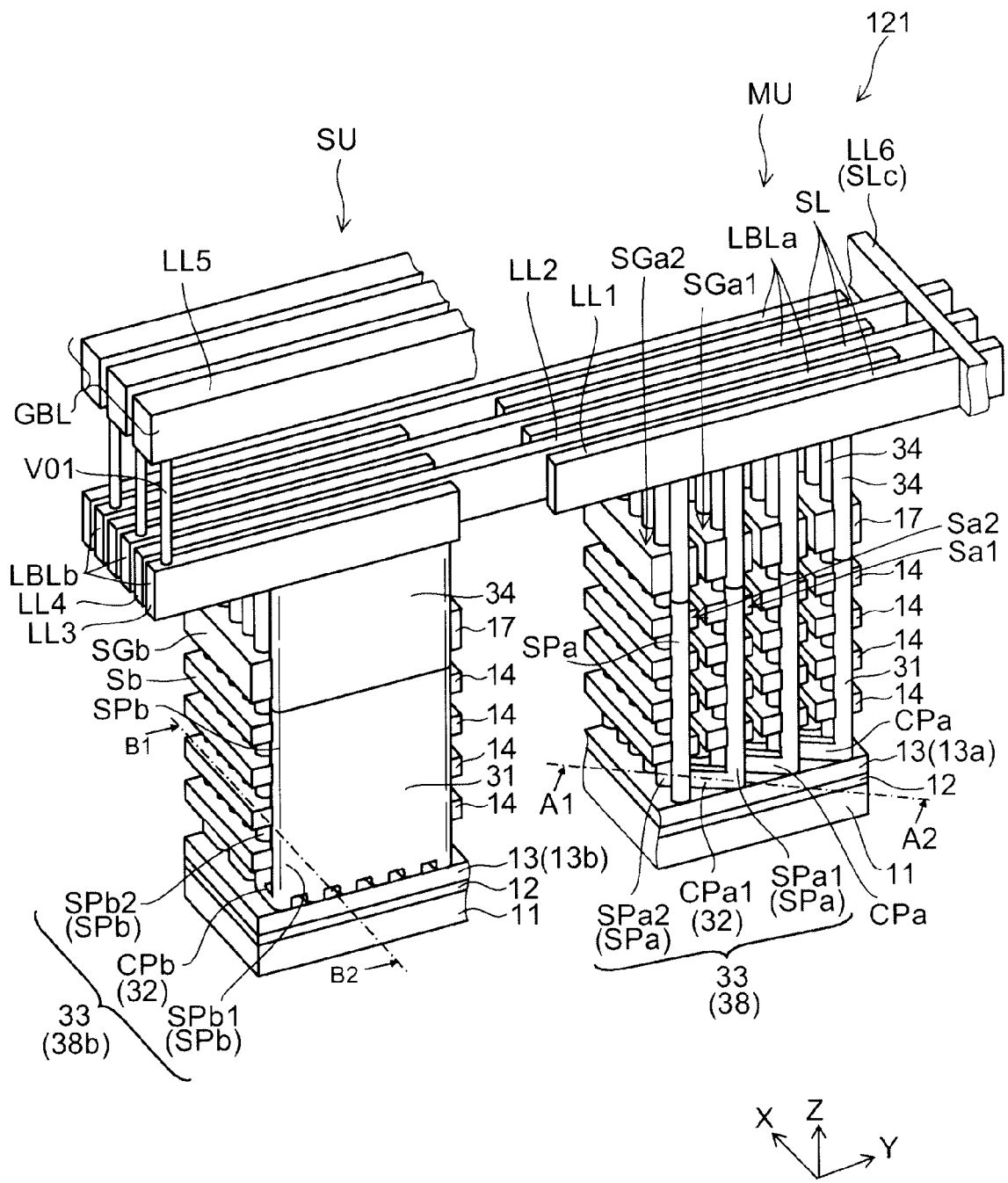
FIG. 13 is a schematic perspective view of the configuration of another nonvolatile semiconductor memory device according to the second embodiment.

FIG. 13 is a schematic perspective view illustrating the configuration of another nonvolatile semiconductor memory device according to the second embodiment.

Figure 14:
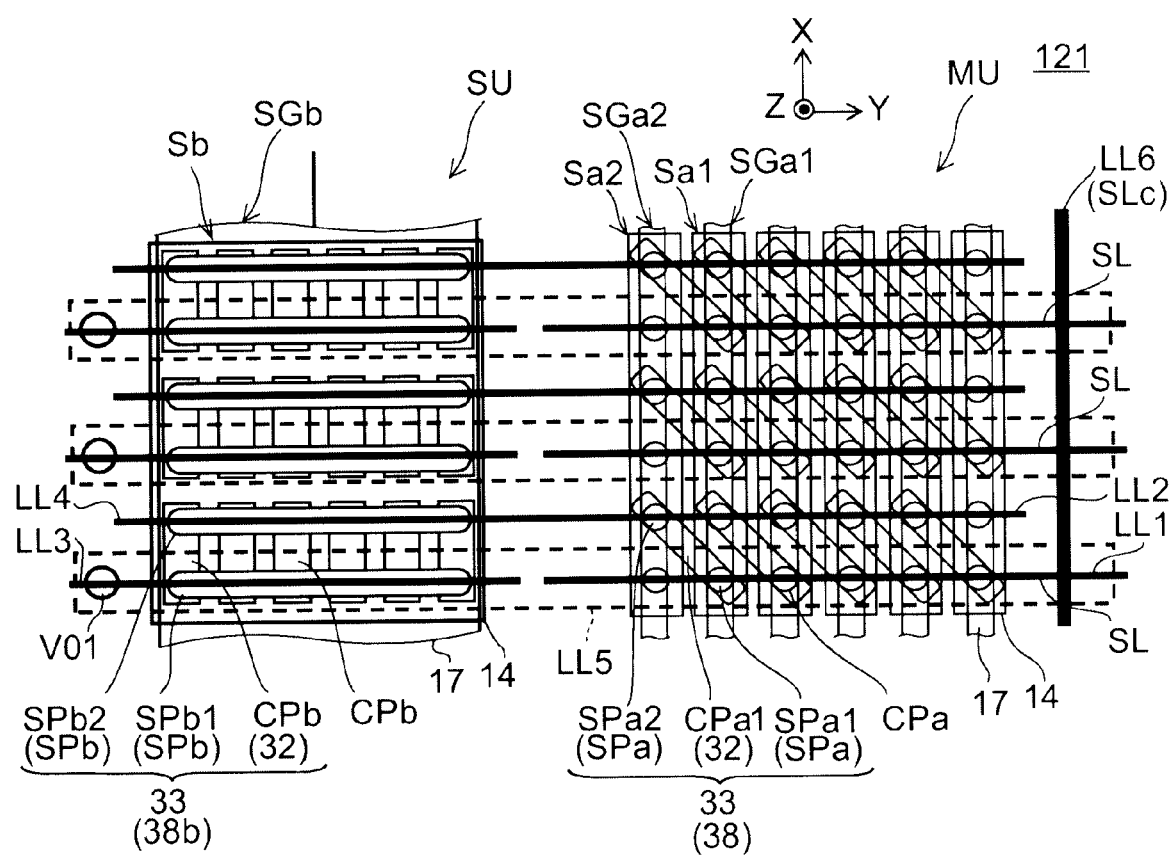
FIG. 14 is a schematic plan view of the configuration of another nonvolatile semiconductor memory device according to the second embodiment.

FIG. 14 is a schematic plan view illustrating the configuration of this nonvolatile semiconductor memory device according to the second embodiment.

As illustrated in FIG. 13 and FIG. 14, the memory cell array unit MU of a nonvolatile semiconductor memory device 121 according to this embodiment is similar to that of the nonvolatile semiconductor memory device 110; and a description is therefore omitted. In the nonvolatile semiconductor memory device 121, the selection unit electrode film WLb and the selection unit selection gate electrode SGb provided in the selection unit SU are not divided.

In the nonvolatile semiconductor memory device 121 as illustrated in FIG. 13 and FIG. 14, the cross section in the X-Y plane of the selection unit semiconductor pillar SPb of the selection unit SU is a flattened circular configuration having a long axis along the Y axis direction. In other words, the selection unit semiconductor pillar SPb has a structure in which, for example, the multiple selection unit semiconductor pillars SPb of the nonvolatile semiconductor memory device 120 are linked in the Y axis direction.

In this specific example, the selection unit connection portion CPb is divided along the Y axis direction.

Figure 15:
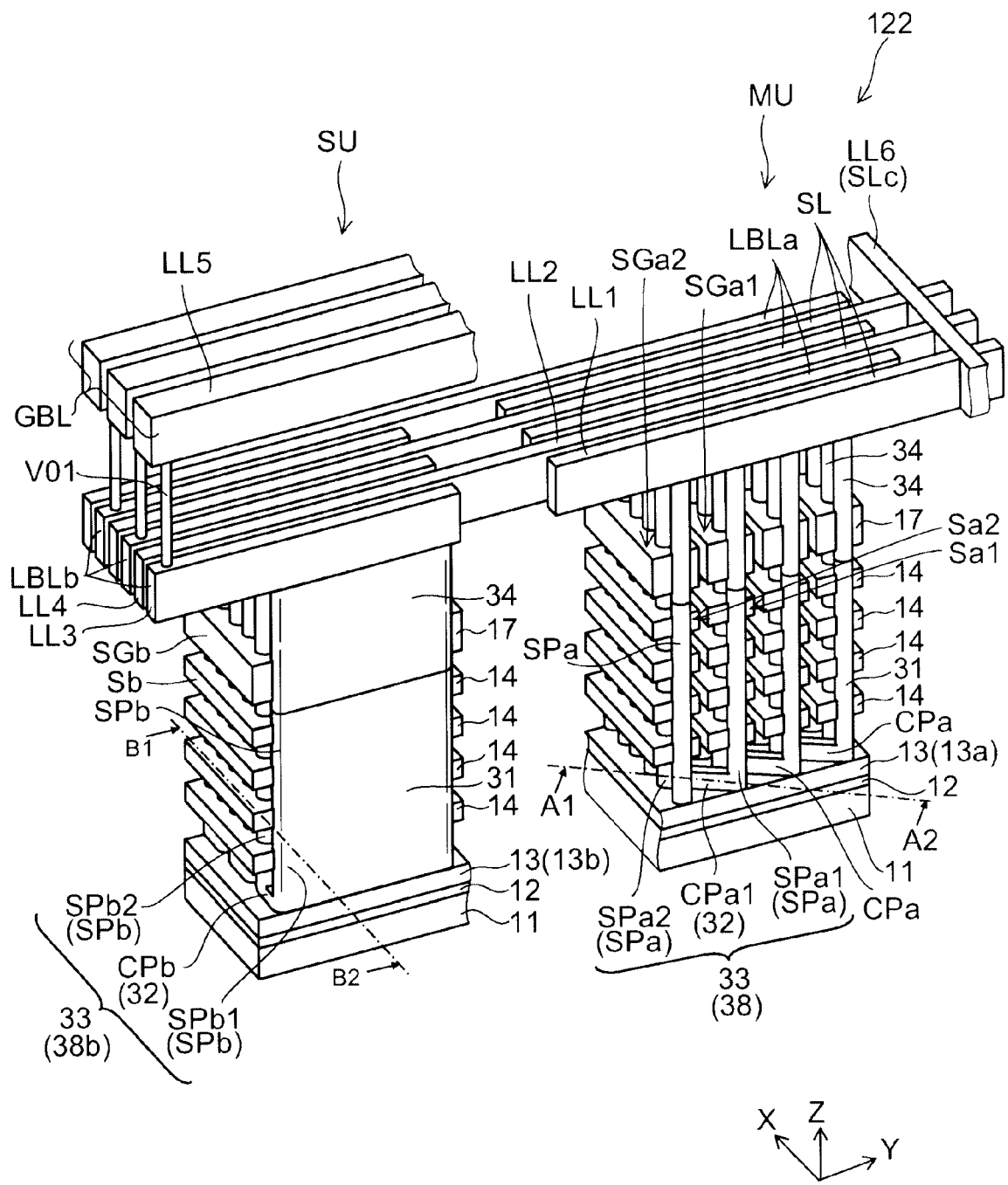
FIG. 15 is a schematic perspective view of the configuration of another nonvolatile semiconductor memory device according to the second embodiment.

FIG. 15 is a schematic perspective view illustrating the configuration of another nonvolatile semiconductor memory device according to the second embodiment.

Figure 16:
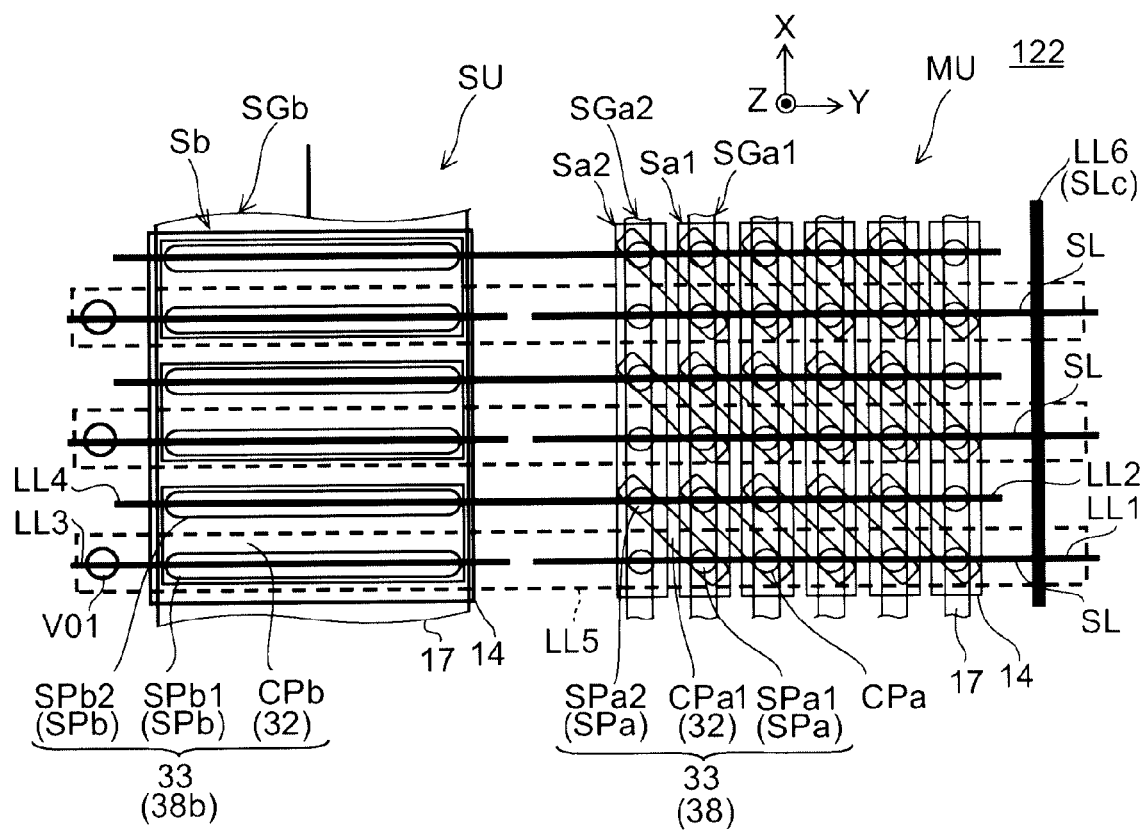
FIG. 16 is a schematic plan view of the configuration of another nonvolatile semiconductor memory device according to the second embodiment.

FIG. 16 is a schematic plan view illustrating the configuration of this nonvolatile semiconductor memory device according to the second embodiment.

The memory cell array unit MU of a nonvolatile semiconductor memory device 122 according to this embodiment as illustrated in FIG. 15 and FIG. 16 is similar to that of the nonvolatile semiconductor memory device 110; and a description is therefore omitted. In the nonvolatile semiconductor memory device 122, the selection unit electrode film WLb and the selection unit selection gate electrode SGb provided in the selection unit SU are not divided.

In the nonvolatile semiconductor memory device 122 as illustrated in FIG. 15 and FIG. 16, the cross section in the X-Y plane of the selection unit semiconductor pillar SPb of the selection unit SU is a flattened circular configuration having a long axis along the Y axis direction; and the selection unit semiconductor pillar SPb has a structure in which, for example, the multiple selection unit semiconductor pillars SPb of the nonvolatile semiconductor memory device 120 are linked in the Y axis direction.

In this specific example, the selection unit connection portions CPb also are linked along the Y axis direction.

According to the nonvolatile semiconductor memory devices 121 and 122 having such configurations as well, a nonvolatile semiconductor memory device enabling increased productivity and operational stability can be provided. The driving capacity is increased by making the cross section of the selection unit semiconductor pillar SPb in a flattened circular configuration; the operational stability is increased even more; and the surface area of the selection unit SU can be reduced even more.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components included in nonvolatile semiconductor memory devices such as semiconductor substrates, electrode films, insulating films, insulating layers, stacked structural bodies, memory layers, charge storage layers, semiconductor pillars, word lines, bit lines, local bit lines, global bit lines, source lines, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices practicable by an appropriate design modification by one skilled in the art based on the nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device, comprising:
   a first stacked structural body including a plurality of first electrode films alternately stacked in a first direction with a plurality of first inter-electrode insulating films, the plurality of first electrode films and the plurality of first inter-electrode insulating films being aligned in a second direction orthogonal to the first direction;
   a first selection gate electrode stacked with the first stacked structural body along the first direction to align in the second direction;
   a first semiconductor pillar piercing the first stacked structural body and the first selection gate electrode in the first direction;
   a first memory layer provided between the first semiconductor pillar and each of the plurality of first electrode films;
   a second stacked structural body including a plurality of second electrode films alternately stacked in the first direction with a plurality of second inter-electrode insulating films, the plurality of second electrode films and the plurality of second inter-electrode insulating films being aligned in the second direction;

a second selection gate electrode stacked with the second stacked structural body along the first direction to align in the second direction;

a second semiconductor pillar piercing the second stacked structural body and the second selection gate electrode in the first direction;

a second memory layer provided between the second semiconductor pillar and each of the plurality of second electrode films;

a first interconnection connected to one end of the first semiconductor pillar to align in a third direction orthogonal to the first direction and intersecting the second direction;

a second interconnection connected to one end of the second semiconductor pillar to align in the third direction;

a memory unit connection portion connecting one other end of the first semiconductor pillar to one other end of the second semiconductor pillar;

a selection unit stacked structural body including a plurality of selection unit electrode films alternately stacked in the first direction with a plurality of selection unit inter-electrode insulating films;

a selection unit selection gate electrode stacked with the selection unit stacked structural body along the first direction;

a first selection unit semiconductor pillar and a second selection unit semiconductor pillar piercing the selection unit stacked structural body and selection unit selection gate electrode in the first direction;

a third interconnection connected to one end of the first selection unit semiconductor pillar to align in a fourth direction orthogonal to the first direction;

a fourth interconnection aligned in the fourth direction to electrically connect to the second interconnection and connect to one end of the second selection unit semiconductor pillar;

a selection unit connection portion connecting one other end of the first selection unit semiconductor pillar to one other end of the second selection unit semiconductor pillar; and a fifth interconnection aligned in a fifth direction orthogonal to the first direction on a side of the third interconnection opposite to the selection unit stacked structural body, the fifth interconnection being electrically connected to the third interconnection.

2. The device according to claim 1, wherein:

the plurality of selection unit electrode films is divided into
  a plurality of third electrode films aligned in the second direction and
  a plurality of fourth electrode films aligned in the second direction;

the selection unit stacked structural body is divided into
  a third stacked structural body including the plurality of third electrode films and
  a fourth stacked structural body including the plurality of fourth electrode films;

the selection unit selection gate electrode is divided into
  a third selection gate electrode stacked with the third stacked structural body along the first direction to align in the second direction and
  a fourth selection gate electrode stacked with the fourth stacked structural body along the first direction to align in the second direction;

the first selection unit semiconductor pillar pierces the third stacked structural body and the third selection gate electrode in the first direction; and the second selection unit semiconductor pillar pierces the fourth stacked structural body and the fourth selection gate electrode in the first direction.

3. The device according to claim 1, wherein a distance between the third interconnection and the selection unit stacked structural body and a distance between the fourth interconnection and the selection unit stacked structural body are substantially equal to a distance between the first interconnection and the first stacked structural body.

4. The device according to claim 1, wherein the third direction is orthogonal to the second direction.

5. The device according to claim 1, wherein the fourth direction and the fifth direction are parallel to the third direction.

6. The device according to claim 1, wherein a width of the fifth interconnection along a direction orthogonal to the fifth direction is not less than 1.5 times and not more than 2.5 times a width of the third interconnection along a direction orthogonal to the fourth direction.

7. The device according to claim 1, wherein the fifth interconnection is multiply provided along a direction orthogonal to the fifth direction and a spacing between the plurality of fifth interconnections is not less than 1.5 times and not more than 2.5 times a spacing between the third interconnection and the fourth interconnection.

8. The device according to claim 1, further comprising
  a memory unit connection portion gate electrode contacting the memory unit connection portion, and
  a selection unit connection portion gate electrode contacting the selection unit connection portion.

9. The device according to claim 1, wherein an alignment direction of the selection unit connection portion is substantially parallel to an alignment direction of the memory unit connection portion.

10. The device according to claim 1, wherein a set including the first selection unit semiconductor pillar, the second selection unit semiconductor pillar, and the selection unit connection portion is multiply provided along the fourth direction, the third interconnection is connected to each of the one ends of the plurality of first selection unit semiconductor pillars of the plurality of sets, and the fourth interconnection is connected to each of the one ends of the plurality of second selection unit semiconductor pillars of the plurality of sets.

11. The device according to claim 1, further comprising:
  a third selection unit semiconductor pillar adjacent to the first selection unit semiconductor pillar along a direction intersecting the fourth direction, the third selection unit semiconductor pillar piercing the selection unit stacked structural body and the selection unit selection gate electrode in the first direction, one end of the third selection unit semiconductor pillar being connected to the fourth interconnection;
  a fourth selection unit semiconductor pillar adjacent to the first selection unit semiconductor pillar along the fourth direction and adjacent to the second selection unit semiconductor pillar along the direction intersecting the fourth direction, the fourth selection unit semiconductor pillar piercing the selection unit stacked structural body and the selection unit selection gate electrode in the first direction, one end of the fourth selection unit semiconductor pillar being connected to the third interconnection; and
  an intersecting connection portion connecting one other end of the third selection unit semiconductor pillar to one other end of the fourth selection unit semiconductor pillar and intersecting the selection unit connection portion.

12. The device according to claim 1, wherein an alignment direction of the selection unit connection portion is substantially parallel to the second direction.

13. The device according to claim 1, wherein a width of the selection unit connection portion along a direction orthogonal to a direction from the first selection unit semiconductor pillar toward the second selection unit semiconductor pillar is less than a distance along the fourth direction from a center of the first selection unit semiconductor pillar along the fourth direction to a center of the second selection unit semiconductor pillar along the fourth direction.

14. The device according to claim 1, further comprising a sixth interconnection connected to one end of the first interconnection.

15. The device according to claim 1, wherein the first semiconductor pillar, the second semiconductor pillar, and the memory unit connection portion include polysilicon or amorphous silicon.

16. The device according to claim 1, wherein the first selection unit semiconductor pillar, the second selection unit semiconductor pillar, and the selection unit connection portion include a material substantially equal to a material of the first semiconductor pillar, the second semiconductor pillar, and the memory unit connection portion.

17. The device according to claim 1, wherein the first memory layer and the second memory layer are charge storage layers.

18. The device according to claim 1, wherein the first memory layer and the second memory layer include silicon nitride.

19. The device according to claim 1, further comprising:
a first inner insulating film provided between the first semiconductor pillar and the first memory layer;
a first outer insulating film provided between the first memory layer and the plurality of first electrode films;
a second inner insulating film provided between the second semiconductor pillar and the second memory layer; and
a second outer insulating film provided between the second memory layer and the plurality of second electrode films.

20. The device according to claim 19, wherein the first inner insulating film, the first outer insulating film, the second inner insulating film, and the second outer insulating film include silicon oxide.

* * * * *